United States Patent [19]

Harris et al.

[11] Patent Number: 4,492,954
[45] Date of Patent: Jan. 8, 1985

[54] DIGITAL-TO-ANALOG CONVERTER

[75] Inventors: David J. Harris, San Jose; Charles L. Vinn, Milpitas, both of Calif.

[73] Assignee: Raytheon Company, Lexington, Mass.

[21] Appl. No.: 608,928

[22] Filed: May 11, 1984

Related U.S. Application Data

[63] Continuation of Ser. No. 334,190, Dec. 24, 1981, abandoned.

[51] Int. Cl.$^3$ ............................................ H03K 13/05
[52] U.S. Cl. ...................... 340/347 DA; 340/347 CC; 340/347 M
[58] Field of Search .................. 340/347 M, 347 DA; 357/51

[56] References Cited

U.S. PATENT DOCUMENTS

| | | | |
|---|---|---|---|
| 3,217,147 | 11/1965 | Chapman, Jr. | 340/347 DA |
| 3,961,326 | 6/1976 | Craven | 340/347 DA |
| 4,045,793 | 8/1977 | Moench | 340/347 DA |
| 4,092,639 | 5/1978 | Schoeff | 340/347 DA |
| 4,295,063 | 10/1981 | Price, Jr. | 330/252 X |
| 4,336,528 | 6/1982 | Kane | 340/347 M X |

*Primary Examiner*—T. J. Sloyan

*Attorney, Agent, or Firm*—Richard M. Sharkansky; Joseph D. Pannone

[57] ABSTRACT

A digital-to-analog conversion circuitry is provided wherein a switching network is adapted to couple, or decouple, a selected one, or ones, of a plurality of identical current sources to, or from, an output bus selectively in accordance with the digital word being converted to produce an output current through an output bus having a level related to such digital word. The switching network includes: a logic network for selectively combining the plurality of bits of the digital word to produce a plurality of control signals, at least one thereof being related to a plurality of the bits of the digital word; and, a plurality of switching transistors, each one thereof having: a control (or base) electrode coupled to a corresponding one of the plurality of control signals; a first (or emitter) electrode coupled to a corresponding one of the plurality of identical current sources; and a second (or collector) electrode coupled to the output bus, such current source being coupled to, or decoupled from, such output bus selectively in accordance with the control signal fed to the control electrode of the transistor coupled to such current source, the logic network produces the plurality of control signals with substantially equal switching level variations.

12 Claims, 8 Drawing Figures

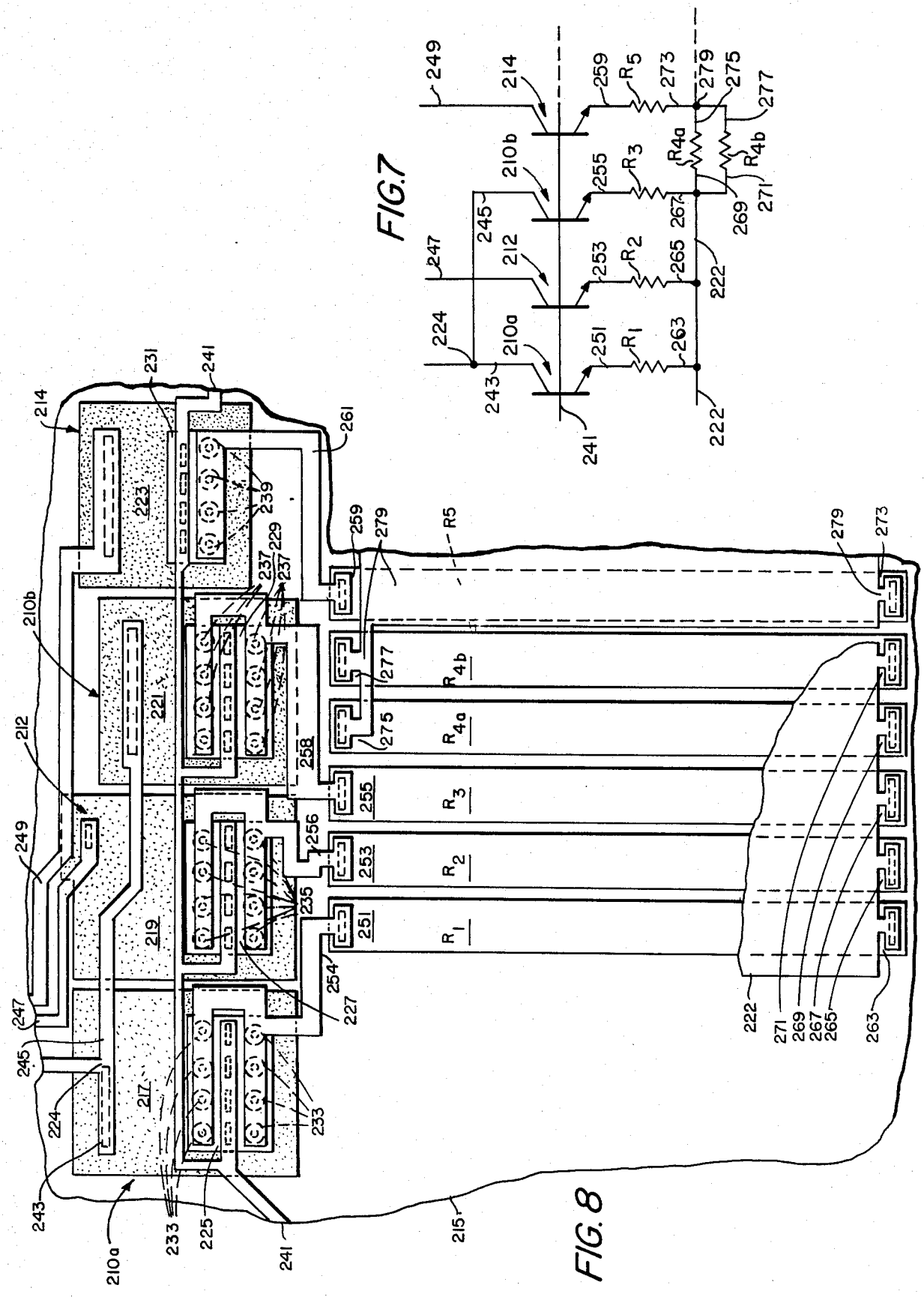

DIGITAL-TO-ANALOG CONVERTER

This application is a continuation of application Serial No. 334,190 filed Dec. 24, 1981, abandoned.

BACKGROUND OF THE INVENTION

This invention relates generally to digital-to-analog conversion circuitry and more particularly to digital-to-analog conversion circuitry adapted for monolithic integrated circuit fabrication.

As is known in the art, digital-to-analog converters (DAC's) have a wide range of applications. One type of monolithic integrated circuit DAC includes an R-2R resistor ladder network. With such ladder network, a current is produced in a first rung of the network and the current through each succeeding rung is reduced by a 2:1 factor. Thus, the ladder network generates in the rungs thereof binarily weighted currents. The binarily weighted current produced through each rung of the ladder network is coupled to a switch. Each switch is activated, or deactivated, selectively in response to a corresponding bit of the digital word being converted to couple, or decouple, the current to, or from, an output bus selectively in accordance with the logical state of the bit. The binarily weighted currents are thus selectively coupled to the output bus and are thereby combined to produce a resultant current through the output bus proportional to the digital word being converted. As the resolution requirements for the DAC are increased, the number of bits of the digital word being converted are correspondingly increased and the accuracy of the current produced in the first rung of the R-2R resistor ladder network becomes correspondingly more critical. For example, in a 12 bit DAC using the R-2R resistor ladder network described, the accuracy of the resistor in the first rung thereof must be held to an accuracy of within 0.02 per cent of its ideal value.

One technique suggested for reducing the high degree of accuracy required for the first resistor of the R-2R ladder network has been to provide $2^N$ identical current sources, where N is the number of bits in the digital word being converted. Because of the relatively large number of current sources required, however, as where a 12 bit DAC is desired, a compromise has been suggested where the R-2R ladder network is used for conversion of the least significant bits of the digital word, (for example, the 9 least bit significant bits of a 12 bit digital word) while the use of eight identical current sources is used in the conversion of the three most significant bits of the digital word. The currents coupled to an output bus from the eight identical current sources selectively in accordance with the three most significant bits are added with the currents produced in the rungs of the R-2R ladder network and selectively coupled to the output bus in accordance with the 9 least significant bits of the digital word so that, based on the principle of superposition, the total current flow produced through the output bus is proportional to the entire 12 bits of the digital word. With such arrangement, an error in the level of the current produced by any one of the eight "identical" current sources reduces the accuracy of the DAC. Therefore, to fully realize the advantage of such technique, the switching circuitry used to couple a selected one, or ones, of the eight current sources to the output bus should not contribute significantly to errors in the levels of currents produced by such current sources.

One switching circuit which has been suggested, however, does contribute errors in producing the desired output current. One source of error in such switching circuit arises from the fact that since any practical current source generally has a finite output impedance, the actual current supplied by the current source is related to the voltage applied to its output terminal. With the switching circuit suggested, the voltage applied to the output terminal of any one of the current sources is a function of the logical states of the bits of the digital word being converted and hence the amount of current produced by such current source is not independent of the digital word being converted. Further, an additional source of error with such switching circuitry in producing the proper current flow through the output bus arises from the fact that the current supplied by each current source passes to the output bus through a plurality of different electrical paths dependent on the digital word being converted. Each electrical path includes an active npn transistor and hence, since the transistors in the different electrical paths have different alphas (collector current to emitter current gain ratios) and since the bits of the digital word are fed to the base electrodes of such transistors and the current produced by the current source flows to the output bus through the emitter-collector electrodes of the transistor in its path, the amount of current actually contributed by such current source to the total flow of current through the output bus is dependent on the digital word being converted. Still further, the switching circuit suggested produces switching signals for the base electrodes of the transistors which differ in level variation depending on the digital word being converted so that when larger variations in signal level are produced, the switching times of the transistors responding to such signals are increased.

SUMMARY OF THE INVENTION

In accordance with the present invention, digital-to-analog conversion circuitry is provided wherein a switching network is adapted to couple, or decouple, a selected one, or ones, of a plurality of identical current sources to, or from, an output bus selectively in accordance with the digital word being converted to produce an output current through an output bus having a level related to such digital word. The switching network includes: a logic network for selectively combining the plurality of bits of the digital word to produce a plurality of control signals, at least one thereof being related to a plurality of the bits of the digital word; and, a plurality of switching transistors, each one thereof having: a control (or base) electrode coupled to a corresponding one of the plurality of control signals; a first (or emitter) electrode coupled to a corresponding one of the plurality of identical current sources; and a second (or collector) electrode coupled to the output bus, such current source being coupled to, or decoupled from, such output bus selectively in accordance with the control signal fed to the control electrode of the transistor coupled to such current source.

In accordance with the invention, the logic network produces the plurality of control signals with substantially equal switching level variations. Further, the voltage applied to each current source is substantially independent of the digital words being converted so that the effect of the output impedance on the level of the current produced by such current source is substantially independent of the digital words being converted. Still further, each one of the identical current sources, when coupled to the output bus in response to the digital words being converted, always passes through the same one of the plurality of switching transistors independent of the digital words requiring such coupling. With such arrangement, the level of current produced by each current source and its contribution to the total output current are independent of the digital word being converted and the level of current contributing to the total current flow through the output bus is also independent of the digital word being converted. Further, the switching time of the switching transistors is also independent of the digital word being converted.

In a preferred embodiment of the invention, the logic network includes a first plurality of logic gates, each one thereof being coupled to at least one of the bits of the digital word for providing AND logic functions and complimentary logic functions on such bits. Each one of such logic gates is coupled to a corresponding one of a second plurality of current sources. A reference current source is coupled to a bias voltage bus through a resistor, for producing a reference voltage across such resistor proportional to the current produced by the reference current source. The reference current source is thermally and electrically matched to the second plurality of current sources. Each one of the second plurality of current sources is serially coupled to the bias voltage bus through a resistor included in such logic gate. In response to the bits of the digital word coupled to a logic gate, the resistor therein produces a logic signal representative of the logical state of the bit, or bits, of the digital word fed to such gate. Since each of the second plurality of current sources is matched to the reference current source, the resistor coupled to the reference current source is selected as half that of the resistors included in the logic gates so that the state of the logic signal produced by the resistor of such gate is determined by whether the level of such logic signal is above or below the reference voltage. A second plurality of logic gates is fed by the logic signals produced by the first plurality of logic gates for providing NOR and OR logic functions on such logic signals. Each one of the second plurality of gates has as its threshold level voltage, the reference voltage produced by the first plurality of logic gates. The second plurality of gates produces the control signals for the switching transistors. The logical state of each control signal is related to the level of the logic signals fed to the gates in the second plurality thereof by the first plurality of logic gates relative to the level of the reference voltage. In this way, the threshold level used by the second plurality of gates in generating the logical states for the control signals is generated by the reference current source which, as mentioned above, is thermally and electrically matched to the second plurality of current sources.

BRIEF DESCRIPTION OF THE DRAWINGS

For a more complete understanding of the concepts of this invention, reference is now made to the following description taken together in conjunction with the accompanying drawings, in which:

FIG. 7 is a schematic diagram of a portion of a resistor ladder network used in the DAC of FIG. 1; and FIG. 8 is a schematic plan view of a portion of an integrated circuit having formed therein the portion of the resistor ladder network of FIG. 7.

DESCRIPTION OF THE PREFERRED EMBODIMENTS

Figure 1:
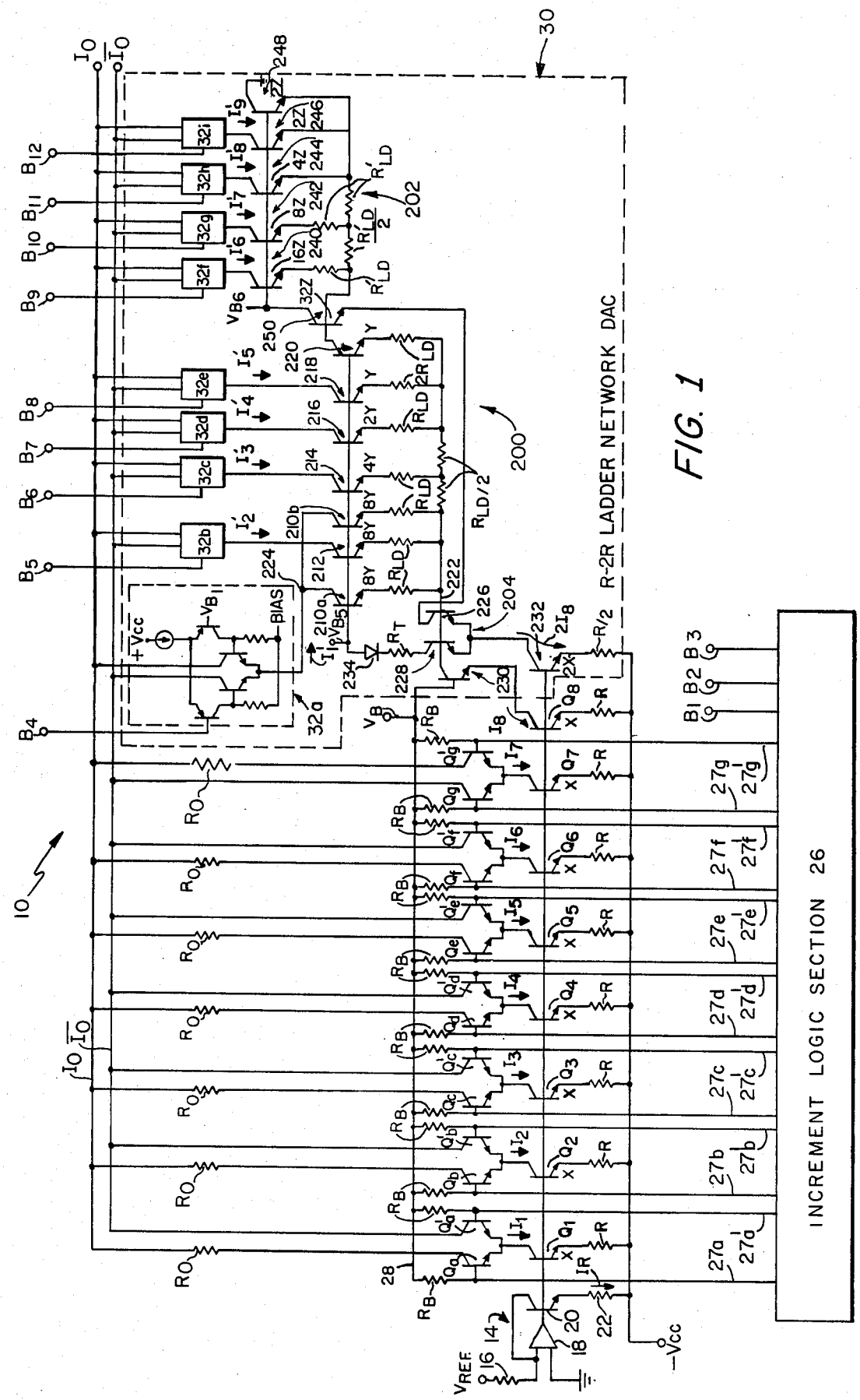
FIG. 1 is a schematic diagram of a 12 bit DAC according to the invention.

Referring now to FIG. 1, a digital-to-analog converter (DAC) 10, here a 12 bit DAC, is shown to include a reference current source 14 made up of a reference resistor 16 coupled to a reference voltage source $+V_{REF}$ (here $+10$ volts), operational amplifier 18, transistor 20 and resistor 22 arranged as shown in a conventional manner to produce a reference current $I_R$ through reference resistor 22. A plurality of transistors $Q_1$ to $Q_8$ is provided with base electrodes thereof connected to the base electrode of transistor 20, as shown. The emitter electrodes of transistors $Q_1$ to $Q_8$ are connected to a $-V_{cc}$ supply (here $-15$ volts) through corresponding resistors R, as shown. Here the emitter area of transistor 20 (designated $4\times$) is four times the emitter area of each of the transistors $Q_1$ to $Q_8$ (designated X) and the resistance of resistor 22 is $R/4$ so that the current flow through the collector electrodes of each of the transistor $Q_1$ to $Q_8$ will be equal to one-fourth the reference current $I_R$. Thus, transistor $Q_1$ to $Q_8$ provides a plurality of, here 8, identical or equal current sources $I_1$ to $I_8$, respectively, as indicated.

Each one of the equal current sources $I_1$ to $I_7$ is connected to a corresponding one of seven pairs of switching transistors $Q_a, Q_a'$ to $Q_g, Q_g'$ and current source $I_8$ is connected to an R-2R resistor ladder digital-to-analog converter (DAC) section 30, as indicated. The base electrodes of switching transistors $Q_a, Q_a'$ to $Q_g, Q_g'$ are connected to an increment logic section 26 through control lines $27a, 27a'$ to $27g, 27g'$, respectively, as indicated, and to a bus 28 through equal valued biasing resistors $R_B$, as indicated. Coupled to bus 28 is a bias voltage $V_B$. The collector electrode of one of the transistors in each one of the pairs thereof, here transistors $Q_a$ to $Q_f$ and $Q_g'$, is connected to an output bus $I_o$ through a resistor $R_o$, and the collector electrode of each one of the other transistors in each pair thereof; i.e. transistors $Q_a'$ to $Q_f'$ and $Q_g$, is connected to output bus $\overline{I_o}$. (It is noted that resistors $R_o$ may also be included between the collector electrodes and output bus $\overline{I_o}$). The three most significant bits $B_1, B_2, B_3$ of the digital word being converted, where $B_1$ is the most significant bit (MSB), are coupled to the increment logic section 26, as indicated. The least significant bits $B_4, B_5, B_6, B_7, B_8, B_9, B_{10}, B_{11}, B_{12}$, where $B_{12}$ is the least significant bit (LSB), of such digital word are coupled to the R-2R resistor ladder network digital-to-analog converter (DAC) section 30, as indicated.

In response to bits $B_1, B_2, B_3$ selected ones of the current sources $I_1$ to $I_7$ are coupled to output bus $I_o$ and the remaining ones of the current sources $I_1$ to $I_7$ are coupled to output bus $\overline{I_o}$ with the sum of the currents coupled to bus $\overline{I_o}$ being proportional to the three MSB's of the digital word and the sum of the currents coupled to bus $I_o$ being proportional to the complement of the three MSB's of such digital word. The current source $I_8$ is fed as a reference current to the R-2R resistor ladder network DAC 30, the details of which will be described hereinafter. Sufficient to say here, however, that in response to the current $I_8$ fed to DAC 30 nine binarily weighted currents $I_1'=I_R/8$; $I_2'=I_R/16$; $I_3'=I_R/32$; ... $I_9'=I_R/2048$ are produced as indicated. Switches 32a–32i are coupled to the current sources $I_1'$ to $I_9'$, respectively, as indicated. Such switches 32a–32i are here conventional current switches identical to that shown for switch 32a for coupling the current source fed thereto to either output bus $I_o$ or $\overline{I_o}$ selectively in accordance with the logical state of the bit feeding such current switch. Thus, each current switch includes a pair of transistors with the base electrode of one of the transistors coupled to a reference voltage $V_{B1}$ (here 1.4 volts) and the base of the other connected to a bit of the digital word being connected. Here a logical 1 couples the current source fed to such switch to output bus $I_o$ and a logical 0 couples the current source fed to such switch to bus $\overline{I_o}$. It follows then that the sum of the currents produced by current sources $I_1'$ to $I_9'$ and coupled to output bus $\overline{I_o}$ is proportional to the lower order bit portion (i.e. bits $B_4$ to $B_{12}$) of the digital word and the sum of the currents produced by current sources $I_1'$ to $I_9'$ and coupled to output bus $\overline{I_o}$ is proportional to the complement of bits $B_4$ to $B_{12}$. Using the well known principal of superposition, it follows that the level of current on bus $I_o$ is proportional to the 12 bit digital word and the level of current on bus $\overline{I_o}$ is proportional to the complement of the 12 bit digital word.

Increment logic section 26, the details of which will be described in connection with FIG. 2, produces logical signals on control lines 27a, 27a' to 27g, 27g' in accordance with the logical states of selected combinations of bits $B_1$, $B_2$ and $B_3$. More particularly, the logical signals on control lines 27a, 27a' to 27g, 27g' are summarized in Table I below (where "+" represents a logical OR function, "." represents a logical AND function, and "—" represents a complement function):

TABLE I

| CONTROL LINE | LOGICAL SIGNAL |
|---|---|
| 27a | $B_1 + B_2 + B_3$ |
| 27a' | $\overline{B_1 + B_2 + B_3}$ |
| 27b | $B_1 + B_2$ |
| 27b' | $\overline{B_1 + B_2}$ |
| 27c | $B_1 + (B_2 \cdot B_3)$ |

TABLE I-continued

| CONTROL LINE | LOGICAL SIGNAL |
|---|---|
| 27c' | $\overline{B_1 + (B_2 \cdot B_3)}$ |
| 27d | $B_1$ |
| 27d' | $\overline{B_1}$ |
| 27e | $B_1 \cdot B_2 + B_1 \cdot B_3$ |
| 27e' | $\overline{B_1 \cdot B_2 + B_1 \cdot B_3}$ |
| 27f | $B_1 \cdot B_2$ |
| 27f' | $\overline{B_1 \cdot B_2}$ |
| 27g | $\overline{B_1} + \overline{B_2} + \overline{B_3}$ |
| 27g' | $\overline{\overline{B_1} + \overline{B_2} + \overline{B_3}}$ |

Thus, logical signals are produced on control lines 27a, 27a' to 27g, 27g' in response to the bits $B_1$, $B_2$, $B_3$ of the digital words as indicated in Table II below:

TABLE II

| LOGICAL SIGNALS ON BITS | | | LOGICAL SIGNALS ON CONTROL LINES | | | | | | | | | | | | |
|---|---|---|---|---|---|---|---|---|---|---|---|---|---|---|---|
| $B_1$ | $B_2$ | $B_3$ | 27a | 27a' | 27b | 27b' | 27c | 27c' | 27d | 27d' | 27e | 27e' | 27f | 27f' | 27g | 27g' |
| 0 | 0 | 0 | 0 | 1 | 0 | 1 | 0 | 1 | 0 | 1 | 0 | 1 | 0 | 1 | 1 | 0 |
| 0 | 0 | 1 | 1 | 0 | 0 | 1 | 0 | 1 | 0 | 1 | 0 | 1 | 0 | 1 | 1 | 0 |
| 0 | 1 | 0 | 1 | 0 | 1 | 0 | 0 | 1 | 0 | 1 | 0 | 1 | 0 | 1 | 1 | 0 |
| 0 | 1 | 1 | 1 | 0 | 1 | 0 | 1 | 0 | 0 | 1 | 0 | 1 | 0 | 1 | 1 | 0 |
| 1 | 0 | 0 | 1 | 0 | 1 | 0 | 1 | 0 | 1 | 0 | 0 | 1 | 0 | 1 | 1 | 0 |
| 1 | 0 | 1 | 1 | 0 | 1 | 0 | 1 | 0 | 1 | 0 | 1 | 0 | 0 | 1 | 1 | 0 |
| 1 | 1 | 0 | 1 | 0 | 1 | 0 | 1 | 0 | 1 | 0 | 1 | 0 | 1 | 0 | 1 | 0 |
| 1 | 1 | 1 | 1 | 0 | 1 | 0 | 1 | 0 | 1 | 0 | 1 | 0 | 1 | 0 | 0 | 1 |

Figure 2:
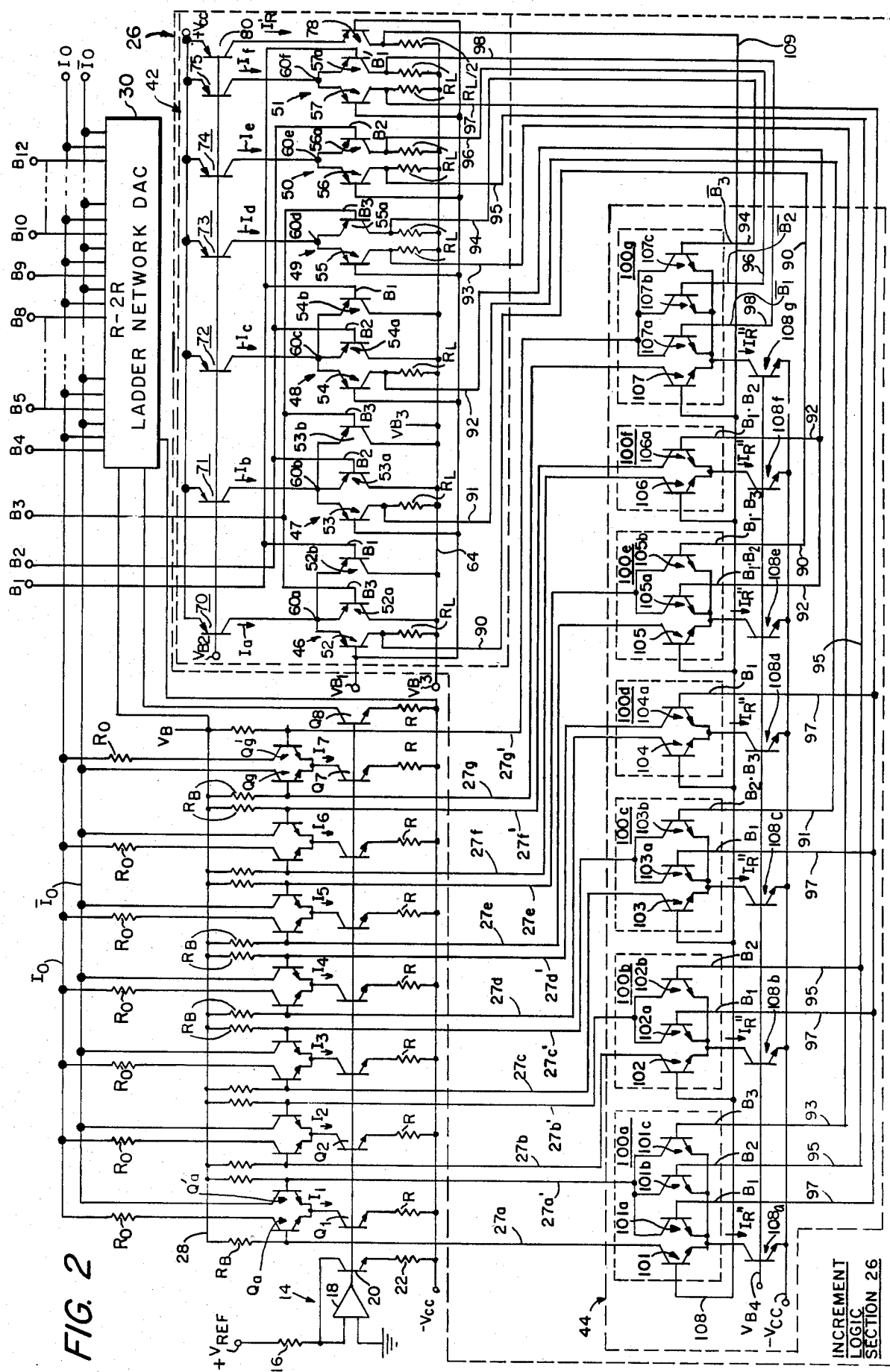
FIG. 2 is a schematic diagram of the 12 bit DAC of FIG. 1 including a schematic diagram of an increment logic section used in such DAC.

Here, as will become apparent in connection with FIG. 2, when logical 1 signals are fed to the control lines 27a, 27a' to 27g, 27g', the switching transistors Qa, Qa' to Qg, Qg' having their base electrodes connected to such control lines are biased to conduction so that the current sources $I_1$ to $I_7$ coupled to them pass to one of the output buses $I_o$, $\overline{I_o}$ connected to them. Thus, it follows then that the current sources $I_1$ to $I_7$ are coupled selectively to either bus $I_o$ or $\overline{I_o}$ in response to bits $B_1$, $B_2$, $B_3$ and this may be represented by the following TABLE III:

TABLE III

| LOGICAL SIGNAL ON BITS | | | DECIMAL EQUIV- ALENT | OUTPUT BUS TO WHICH CURRENT SOURCES ARE COUPLED | | | | | | |
|---|---|---|---|---|---|---|---|---|---|---|
| $B_1$ | $B_2$ | $B_3$ | | $I_1$ | $I_2$ | $I_3$ | $I_4$ | $I_5$ | $I_6$ | $I_7$ |
| 0 | 0 | 0 | $(0)_{10}$ | $\overline{I_o}$ | $\overline{I_o}$ | $\overline{I_o}$ | $\overline{I_o}$ | $\overline{I_o}$ | $\overline{I_o}$ | $\overline{I_o}$ |
| 0 | 0 | 1 | $(1)_{10}$ | $I_o$ | $\overline{I_o}$ | $\overline{I_o}$ | $\overline{I_o}$ | $\overline{I_o}$ | $\overline{I_o}$ | $\overline{I_o}$ |
| 0 | 1 | 0 | $(2)_{10}$ | $I_o$ | $I_o$ | $\overline{I_o}$ | $\overline{I_o}$ | $\overline{I_o}$ | $\overline{I_o}$ | $\overline{I_o}$ |
| 0 | 1 | 1 | $(3)_{10}$ | $I_o$ | $I_o$ | $I_o$ | $\overline{I_o}$ | $\overline{I_o}$ | $\overline{I_o}$ | $\overline{I_o}$ |
| 1 | 0 | 0 | $(4)_{10}$ | $I_o$ | $I_o$ | $I_o$ | $I_o$ | $\overline{I_o}$ | $\overline{I_o}$ | $\overline{I_o}$ |
| 1 | 0 | 1 | $(5)_{10}$ | $I_o$ | $I_o$ | $I_o$ | $I_o$ | $I_o$ | $\overline{I_o}$ | $\overline{I_o}$ |
| 1 | 1 | 0 | $(6)_{10}$ | $I_o$ | $I_o$ | $I_o$ | $I_o$ | $I_o$ | $I_o$ | $\overline{I_o}$ |
| 1 | 1 | 1 | $(7)_{10}$ | $I_o$ | $I_o$ | $I_o$ | $I_o$ | $I_o$ | $I_o$ | $I_o$ |

Therefore, the total current flow through bus $I_o$ and $\overline{I_o}$ from equal current sources $I_1$ to $I_7$ (each producing a current $I_R$), as function of bits $B_1$, $B_2$, $B_3$, may be represented below in Table IV.

TABLE IV

| LOGICAL SIGNAL ON BITS | | | DECIMAL EQUIVALENT | CURRENT FLOW | |
|---|---|---|---|---|---|
| $B_1$ | $B_2$ | $B_3$ | | $I_o$ | $\overline{I_o}$ |
| 0 | 0 | 0 | $(0)_{10}$ | 0 | $7I_{R/4}$ |
| 0 | 0 | 1 | $(1)_{10}$ | $I_{R/4}$ | $6I_{R/4}$ |
| 0 | 1 | 0 | $(2)_{10}$ | $2I_{R/4}$ | $5I_{R/4}$ |
| 0 | 1 | 1 | $(3)_{10}$ | $3I_{R/4}$ | $4I_{R/4}$ |
| 1 | 0 | 0 | $(4)_{10}$ | $4I_{R/4}$ | $3I_{R/4}$ |
| 1 | 0 | 1 | $(5)_{10}$ | $5I_{R/4}$ | $2I_{R/4}$ |
| 1 | 1 | 0 | $(6)_{10}$ | $6I_{R/4}$ | $1I_{R/4}$ |
| 1 | 1 | 1 | $(7)_{10}$ | $7I_{R/4}$ | 0 |

Thus, increment logic section 26 causes $2^N$ levels of current to (where N is the number of bits of the digital word fed to section 26) to be coupled to output line $I_o$ so that the total current flow is proportional to the digital word represented by such N bits. It is also noted that for each one of the $2^N$ digital words fed to such logic section 20 which couples any one of the current sources $I_1$ to $I_7$ to one of the output buses $I_o$, $\overline{I_o}$ such current source always passes through the same switching transistor. Thus, for example, current source $I_4$ is coupled to output bus $\overline{I_o}$ in response to digital words $(0)_{10}$ to $(3)_{10}$ and in response to each one of such digital words produced such current source $I_4$ passes through the same switching transistor, in particular switching transistor $Q_{d'}$. Likewise, current source $I_2$ is coupled to output bus $I_o$ in response to digital words $(2)_{10}$ to $(7)_{10}$ and in response to each one of such digital words produced such source $I_2$ passes to the output bus $I_o$ through the same switching transistor, namely switching transistor $Q_b$. In this way, the current contributed by a selected current source to the total current flow produced through one of the output buses is not affected by the beta of other ones of the switching transistors since such selected current source always coupled to an output bus through the same switching transistor. Further, considering transistors $Q_a$ and $Q_a'$, it is noted that regardless of which one of such transistors is conducting the voltage at the emitter electrodes, and hence at the collector electrode of transistor $Q_1$, is equal to $V_B - V_{BE}$ (where $V_{BE}$ is the base to emitter voltage drop across the conducting one of the transistors, approximately 0.7 volts). Thus, the voltages applied to current sources $I_1$ to $I_8$ are substantially independent of the digital word being converted and hence the effect of the output impedances of such current sources $I_1$ to $I_8$ on the amount of current actually produced by such current sources is substantially independent of the digital word being converted.

Referring now to FIG. 2, the details of increment logic network 26 are shown to include an AND-NAND logic gate section 42 and an OR-NOR gate section 44. The AND-complement logic gate section 42 includes 3 AND gates, 46, 47, 48 and three inverters 49, 50, 51. It is noted that each of the gates 46 to 48 and inverters 49, 51 is similar in construction. The gates 46 to 48 and inverters 49 to 51 include PNP reference transistors 52 to 57 and PNP input transistors 52a, 52b, 53a, 53b, 54a, 54b, 55a, 56a, 57a, as shown. Transistors 52, 52a, 52b of AND gate 46 have their emitter electrodes connected together at terminal 60a; transistors 53, 53a, 53b of AND gate 47 have their emitters connected together at terminal 60b; transistors 54, 54a, 54b of AND gate 48 have their emitters connected together at terminal 60c; transistors 55, 55a of inverter 49 have their emitters connected together at terminal 60d; transistors 56, 56a of inverter 50 have their emitters connected together at terminal 60e; and transistors 57, 57a of inverter 51 have their emitters connected together at terminal 60f. Bit $B_1$ is coupled to the base electrodes of transistors 52b, 54b, and 57a, bit $B_2$ is coupled to the base electrodes of transistors 53a, 54a and 56a and bit $B_3$ is coupled to the base electrodes of transistors 52a, 53b and 55a, as indicated. The collector electrodes of reference transistors 52 to 57 are connected to bus 64 through equal valued load resistors $R_L$, as indicated. The collector electrodes of transistors 52a, 52b, 53a, 53b and 54a, 54b are connected directly to bus 64. The collectors of transistors 55a, 56a and 57a are connected to bus 64 through load resistor $R_L$ equal in value to the above-mentioned load resistor $R_L$. A bias voltage $V_{B3} = (-V_{cc} + 1.4)$ volts is coupled to bus 64 as shown. Terminals 60a to 60f are connected to equal valued current sources $I_a$ to $I_f$, respectively, as indicated and which here include transistors 70 to 75 having base electrodes connected to a bias voltage $V_{B2}$ and emitter electrodes connected to a $+V_{cc}$ supply, as indicated, where $V_{B2} = +V_{cc} - V_{BE}$ and $+V_{cc}$ is here 5 volts. A reference transistor 78 is included, such transistor 78 having its base electrode connected to the base electrode of transistor 52 to 57 as indicated, which is connected to a bias voltage $V_{B1}$, here 1.4 volts, its emitter electrode connected to a current source $I_R'$ (which includes transistor 80) and its collector electrode connected to bus 64 via a load resistor $R_L/2$, the resistance of such resistor being half the resistance of the load resistor $R_L$. The transistor 80 has its emitter electrode connected to bus $+V_{cc}$ and its base electrode connected to the base electrode of transistor 70 to 75. Further, transistor 80 is formed in a portion of the integrated circuit in which the DAC 10 is formed adjacent to that where transistors 70 to 75 are formed so that the temperature (or thermal) and electrical characteristics of transistor 80 are matched to those of transistors 70 to 75. Thus, the current flow produced through the collector electrode of transistor 80 is substantially equal to the current flow produced through the collectors of transistors 70 to 75. Thus if a voltage $(V_1/2)$ (here about 100 millivolts) is produced across load resistor $R_L/2$, a voltage of $V_1$ will be produced across the load resistor, or resistors, $R_L$ which conduct current in a manner to be described. Here a logical 1 signal for bits $B_1$, $B_2$, $B_3$ is represented by a voltage greater than $V_{B1}$ (i.e. 1.4 volts) and a logical 0 signal is represented by a voltage less than 1.4 volts. Thus, if both bits fed to the base electrodes of the pair of input transistors in any one of the AND gates 46, 47, 48 are logical 1 signals, the reference transistor of such AND gate conducts producing a "high" or logical 1 output voltage $(V_1 + V_{B3})$ at the collector thereof, while if either one of the pair of bits is a logical 0, the transistor fed by such logical signal conducts, the input transistor of such AND gate is non-conducting and a "low" or logical 0 output voltage $(V_{B3})$ is produced at the collector electrode of such reference transistor. It also follows that if a logical 0 signal is fed to the base electrode of any one of the input transistors 56a, 57a, 58a of one of the inverters 56, 57, 58, such input transistor conducts and produces a "high" or logical 1 voltage, $V_1 + V_{B3}$, at its collector electrode (a "complement" function) while a "low" or logical 0 voltage, $V_{B3}$, is produced at the collector electrode of the non-conducting reference transistor of such inverter (a "true" function). Conversely, if the input signal to the base electrode of the input transistor of the inverter were a logical 0 signal, the input transistor will conduct producing a "high" or logical 1 voltage $(V_1+V_{B3})$ at its collector electrode while the reference transistor of such inverter produces a "low" or logical 0 voltage $(V_1)$ at its collector electrode. It follows then that the variation in voltage across the load resistor $R_L$ of any one of the AND gates 46, 47, 48 or across either one of the load resistors $R_L$ in the inverters is $V_1$ volts and the voltage produced across load resistor $R_L/2$ is always maintained at the mid point of each such voltage variation, i.e. $(V_{B3}+(V_1/2))$. Further, the voltage across resistor $R_L/2$ will track variations in the voltages produced across load resistor $R_L$ resulting from temperature changes which might effect the current sources $I_a$ to $I_f$ since these changes are tracked by transistor 80 and hence current source $I_R'$. The logical signals produced by the load resistors $R_L$ of AND gates 46, 47, 48 and inverters 49, 50, 51 are summarized below in Table V:

TABLE V

| AND Gate 46 | (output line 90) | $B_1 \cdot B_3$ |
|---|---|---|
| AND Gate 47 | (output line 91) | $B_2 \cdot B_3$ |
| AND Gate 48 | (output line 92) | $B_1 \cdot B_2$ |
| INVERTER 49 | (output line 93) | $B_3$ |
| | (output line 94) | $\overline{B_3}$ |
| Inverter 50: | (output line 95) | $B_2$ |
| | (output line 96) | $\overline{B_2}$ |
| Inverter 51: | (output line 97) | $B_1$ |
| | (output line 98) | $\overline{B_1}$ |

The OR-NOR gate section 44 includes seven gates 100a–100g, as shown. Each one of the gates 100a–100g is similar in construction. The gates 100a–100g include npn reference transistors 101 to 107 and npn input transistors 101a, 101b, 101c, 102a, 102b, 103a, 103b, 104a, 105a, 105b, 106a, 107a, 107b, 107c, as indicated. Reference transistors 101 to 107 have their collectors connected to control lines 27a to 27g, respectively, as indicated. Transistors 101a, 101b, 101c of gate 100a have their collector electrodes connected to control line 27a'; transistors 102a, 102b of gate 100b have their collector electrodes connected to control line 27b'; transistors 103a, 103b of gate 100c have their collector electrodes connected to control line 27c'; transistor 104a of gate 100d has its collector electrode connected to control line 27d'; transistors 105a, 105b of gate 100e have their collector electrodes connected to control line 27e'; transistor 106a of gate 100f has its collector electrode connected to control line 27f'; and transistors 107a, 107b, 107c of gate 100g have their collector electrode connected to control line 27g', as indicated. The emitter electrodes of the transistors in each of the gates 100a to 100g are connected to a corresponding one of a plurality of, here seven, identical current sources $I_R''$, as indicated. Here such current sources include transistors 108a to 108g. Such transistors 108a to 108g have base electrodes connected together and to a bias voltage $V_{B4}$ (here $-V_{cc}+0.7$), as indicated, and emitter electrodes connected to a $-V_{cc}$ bus, as indicated. The collector electrodes of transistors 108a to 108g are connected to gates 100a to 100g, respectively, as indicated. The AND-complement logic gate section 42 is coupled to the OR-NOR gate section 44 as follows: a reference voltage produced at the collector of transistor 78 $(V_{B3}+(V_1/2))$ is fed to the base electrodes of the reference transistors 101 to 107 via bus 109, as shown. The base electrodes of transistors 101a to 107c are connected to output lines 90 to 98 of AND-complement logic gate section 42 in accordance with the following Table VI below:

TABLE VI

| GATE | BASE ELECTRODE OF TRANSISTOR | OUTPUT LINE OF SECTION 42 |
|---|---|---|
| 100a | transistor 101a | line 97 ($B_1$) |
| | transistor 101b | line 95 ($B_2$) |
| | transistor 101c | line 93 ($B_3$) |
| 100b | transistor 102a | line 97 ($B_1$) |
| | transistor 102b | line 95 ($B_2$) |
| 100c | transistor 103a | line 97 ($B_1$) |
| | transistor 103b | line 91 ($B_2 \cdot B_3$) |
| 100d | transistor 104a | line 97 ($B_1$) |
| 100e | transistor 105a | line 92 ($B_1 \cdot B_2$) |
| | transistor 105b | line 90 ($B_1 \cdot B_3$) |
| 100f | transistor 106a | line 92 ($B_1 \cdot B_2$) |
| 100g | transistor 107a | line 98 $\overline{B_1}$) |
| | transistor 107b | line 96 $\overline{B_2}$) |
| | transistor 107c | line 94 $\overline{B_3}$) |

Since the reference voltage fed to transistors 101 to 107 is produced on line 109 and such voltage is, as discussed above, in the middle of the voltage variation of the signals on lines 91 to 98 if any one of the input transistors in any one of the gates 100a to 100g has a voltage fed to its base electrodes greater than the reference voltage on line 109, such transistor will conduct, the reference transistor in such gate will not conduct, and current will flow through the bias resistor $R_B$ connected to such conducting input transistor will produce a "low" voltage at the base electrode of the switching transistor connected thereto so that such switching transistor will be nonconducting while a "high" voltage will be produced at the base electrode of the other one of the switching transistors in the pair thereof placing such transistor in an "on" or conducting condition. Conversely, if all signals fed to the base electrodes of the input transistors in one of the gates 100a to 100g has a voltage less than the reference voltage on line 109, all the input transistors in such gate will be nonconducting while the reference transistors in such gate will be conducting with the result that a "high" voltage will be produced at the base electrode of the switching transistor connected to the input transistor in such gate thereby turning such switching transistor to conduction while the other one of the switching transistors in the pair thereof has its base electrode at a "low" voltage and hence such switching transistor will be biased to a nonconducting condition. It follows then that the collector electrodes of the reference transistor of gates 100a–100g provide an OR logic function and the collector electrodes of the input transistors 101b to 107c provide a NOR logic function. It follows from TABLES V AND VI above that the logic functions presented in TABLE I above are implemented by the increment logic section 26.

Referring again to FIG. 1 the R-2R ladder network DAC 30 is shown in detail to include a master ladder network 200 and a slave ladder network 202 coupled together and fed by current source $I_8$ through an input section 204, as shown. Thus, master ladder network 200 includes transistors 210a, 212, 210b, 214, 216, 218 and 220 having a common base electrode coupled to a bias voltage $V_{B5}$ (here $-3$ volts) and emitter electrodes coupled to bus 222 as follows: the emitter electrodes of transistors 210a, 212 and 210b are coupled to bus 222 through equal valued resistors $R_{LD}$, as shown; the emitter electrode of transistor 214 is coupled to bus 222 through a shunt resistor $R_{LD}$ and a series resistor $R_{LD}/2$, as shown; the emitter electrode of transistor 216 is coupled to bus 222 through a shunt resistor $R_{LD}$ and two serially connected series resistors each having a value $R_{LD}/2$ as shown; the emitter electrodes of transistors 218 and 220 are connected to bus 222 through corresponding shunt resistors 2RLD and the two serially connected resistors $R_{LD}/2$, as shown. The emitter area of transistor 220 is designated as Y and the emitter area of transistor 218 is also Y; the emitter area of transistor 216 is 2Y; the emitter area of transistor 214 is 4Y and the emitter area of each of the transistors 210a, 210b and 212 is 8Y. The collector electrodes of transistors 210a, 210b are connected together at terminal 224. Terminal 224 is connected to switch 32a and the collector electrodes of transistors 212 to 218 are connected to switches 32b to 32e, respectively, as indicated. Bus 222 is connected to the base electrode of transistors 226, 228 and to the collector electrode of transistor 230, as shown. The base electrode of the transistor 230 is connected to the bias voltage $V_B$, as shown. The emitter electrode of transistor 230 is connected to the collector electrode of transistor $Q_8$, as shown. The emitter electrodes of transitors 226, 228 are connected to the collector electrode of transistor 232, as shown. The emitter area of transistor 228 is 63Y and the emitter area of transistor 226 is Y. Transistor 232 has its base electrode connected to the base electrodes of transistors $Q_1$ to $Q_8$, and its emitter electrode connected to $-V_{cc}$ via a resistor R/2. As mentioned above, emitter area of transistor $Q_8$ is X; the emitter area of transistor 232 is 2X. Thus, since transistor $Q_8$ provides a current source $I_8$, a current $2I_8$ passes through the collector electrode of transistor 232. The collector electrode of transistor 228 is coupled to the bias voltage $V_{B5}$ through a resistor $R_T$ and diode 234, as shown. Thus, input section 204 includes transistors 226, 228, 230, 232, resistor $R_T$ and diode 234 and transistor 230 is used to compensate for base current lost in transistors $Q_a$, $Q_a'$ to $Q_g$, $Q_g'$ while transistors 226 and 228 are used to compensate for base current lost in transistors 210a, 210b, 212 to 220 and the switching transistors in switches 32a to 32i. It follows then that the current through bus 222 is separated into five binarily weighted currents $I_1'$ to $I_5'$, as noted above. It is noted that binarily weighted current $I_1'$ is provided to two transistors 210a and 210b, such transistors being physically separated when formed as integrated circuit elements by transistor 212 as will be described below in connection with FIGS. 7 and 8. Further, the resistor $R_{LD}$ connected to the emitter electrodes of transistors 210a, 210b are also physically separated from each other and, in particular, the resistor $R_{LD}$ connected to the emitter electrode of transistor 212 is physically disposed between the former mentioned pair of resistors, as will be described in connection with FIGS. 7 and 8. By laying out the master ladder network 220 such that the current source $I_1'$ associated with the most significant bit (MSB), thereof, here bit $B_4$ is nested with the current source $I_2'$ associated with the second MSB, here bit $B_5$, first order thermal, diffusion and/or sputtering and stress gradients generated across the integrated circuit chip wherein the DAC is formed, are virtually cancelled. That is, referring to FIGS. 7 and 8, the details of the portions of the resistor ladder network coupled between the emitter electrodes of transistors 210a, 212, 210b and 214 are shown schematically in FIG. 7 and are formed in a substrate of the integrated circuit in FIG. 8. As shown in FIG. 7 the emitter electrodes of transistors 210a, 212 and 210b are connected to bus 222 through resistors $R_1$, $R_2$ and $R_3$, respectively, where the resistance of each one of such resistors $R_1$, $R_2$ and $R_3$ is each $R_{LD}$. The emitter of transistor 214 is connected to a resistor $R_5$ at a first end, such resistor $R_5$ having a resistance of $R_{LD}$ as noted above in connection with FIG. 1. A pair of parallel connected resistors $R_{4a}$, $R_{4b}$ are connected between bus 222 and the second end of resistor $R_5$, as shown. The resistance of each resistor $R_{4a}$, $R_{4b}$ is $R_{LD}$ so that the effective resistance between the bus 222 and the second end of resistor $R_5$ is $R_{LD}/2$, as noted above in connection with FIG. 1. Referring now to FIG. 8 the layout of transistors 210a, 212, 210b and 214 and resistors $R_1$, $R_2$, $R_3$, $R_{4a}$, $R_{4b}$; and $R_5$ on an integrated circuit substrate 215 is shown. The collector regions 217, 219, 221, 223 of transistors 210a, 212, 210b and 214 are here n-type conductivity regions formed on substrate 215. Diffused within collector regions 217, 219, 221, 223 are here p-type conductivity base regions 225, 227, 229 and 231, respectively. Resistors $R_1$, $R_2$, $R_3$, $R_{4a}$, $R_{4b}$ and $R_5$ are here sputtered thin film resistors formed on the substrate, as shown using any conventional technique, although such may be formed as p-type conductivity diffused regions in the epitaxial layer. Diffused within the base regions 225, 227, 229 and 231 are circular shaped emitter regions 233, 235, 237 and 239, respectively, as indicated. It is noted that transistors 210a, 212, 210b each has eight emitter regions and transistor 214 has four emitter regions. Contact to the base regions of transistors 210a, 212, 210b is made by conductor 241, as shown. The collector regions 217, 221 of transistors 210a, 210b, respectively, are connected to terminal 224 via conductors 243, 245, respectively, as shown. Collector regions 219, 223 are connected to conductor 247, 249, respectively, as shown. The eight emitter regions of transistors 210a, 212, 210b are connected to the upper ends 251, 253, 255 of resistors $R_1$, $R_2$, $R_3$, respectively, through conductors 254, 256, 258, respectively, as shown. The four emitter regions of transistors 214 are connected to the upper ends 259 of resistor R5, as shown, through conductor 261. The bottom ends 263, 265, 267, 269, 271 of resistors $R_1$, $R_2$, $R_3$, $R_{4a}$, $R_{4b}$, respectively, are connected to bus 222, as shown. The bottom end 273 of resistor $R_5$ is connected to the upper ends 275, 277 of resistors $R_{4a}$, $R_{4b}$ through conductor 279. With such arrangement, the average sputtering or diffusion gradient across the resistors $R_1$, $R_2$, $R_3$ is such that the gradient effect between the resistors $R_1$ and $R_3$ will be substantially equal to the effect on the resistor $R_2$. Further, each one of the resistors $R_1$, $R_2$, $R_3$ will dissipate an equal amount of power since each has the same resistance and each passes the same amount of current. Thus, while a conventional R-2R ladder network DAC may be used in place of DAC 30, DAC 30 provides thermal and sputtering gradient compensation.

Slave network 202 includes transitors 240 to 246 having collector electrodes coupled to switches 32f to 32i, respectively, as indicated, and an output transistor 248 having a grounded collector electrode. Transistors 240 to 248 have common base electrodes coupled to a bias voltage $V_{B6}$ (here $-2.6$ volts), as shown and to the collector of a coupling transistor 250, as shown. The base electrode of transistor 250 is connected to the collector electrode of transistor 220, as shown, and the emitter electrode of transistor 250 is connected to the collector electrode of transistor 226, as shown. The emitter areas of transistors 246, 248 are 2Z and the emitter areas of transistors 244, 242, 240 and 240 are 4Z, 8Z, 16Z and 32Z, respectively, as indicated. The base electrode of transistor 250 is connected to the emitter electrodes of transistors 240 to 248 through a conventional resistor network where shunt resistors $R_{LD}'$ are connected to the emitter electrodes of transistors 240, 242 and resistors $R_{LD}'/2$ are connected as shown to provide the binarily weighted currents $I_6'$ to $I_9'$, as described above. Transistors 226, 250 are provided to compensate for base current lost through transistors 240 to 248. It is also noted that the resistor $R_o$ coupled between the output bus $I_o$ and the collector electrodes of transistor $Q_a$ to $Q_f$ and $Q_g'$ are provided to produce the same voltage drop as that produced across the resistor $R_{LD}$ connected to the emitter electrode of transistor 210a so that the effect of the finite output impedance is the same regardless of the path of the current between the output bus $I_o$ and the source producing such current. The voltage $V_B$ is selected high enough to ensure that $V_B-V_{BE}$ is greater than the output of amplifier 20. This prevents current sources $I_1-I_8$ from saturating. The voltage $V_B$ is also selected to be low enough for maximum output compliance. Here $V_B$ is $-6.8$ volts and the output of amplifier 20 is $-11.4$ volts.

Figure 3:
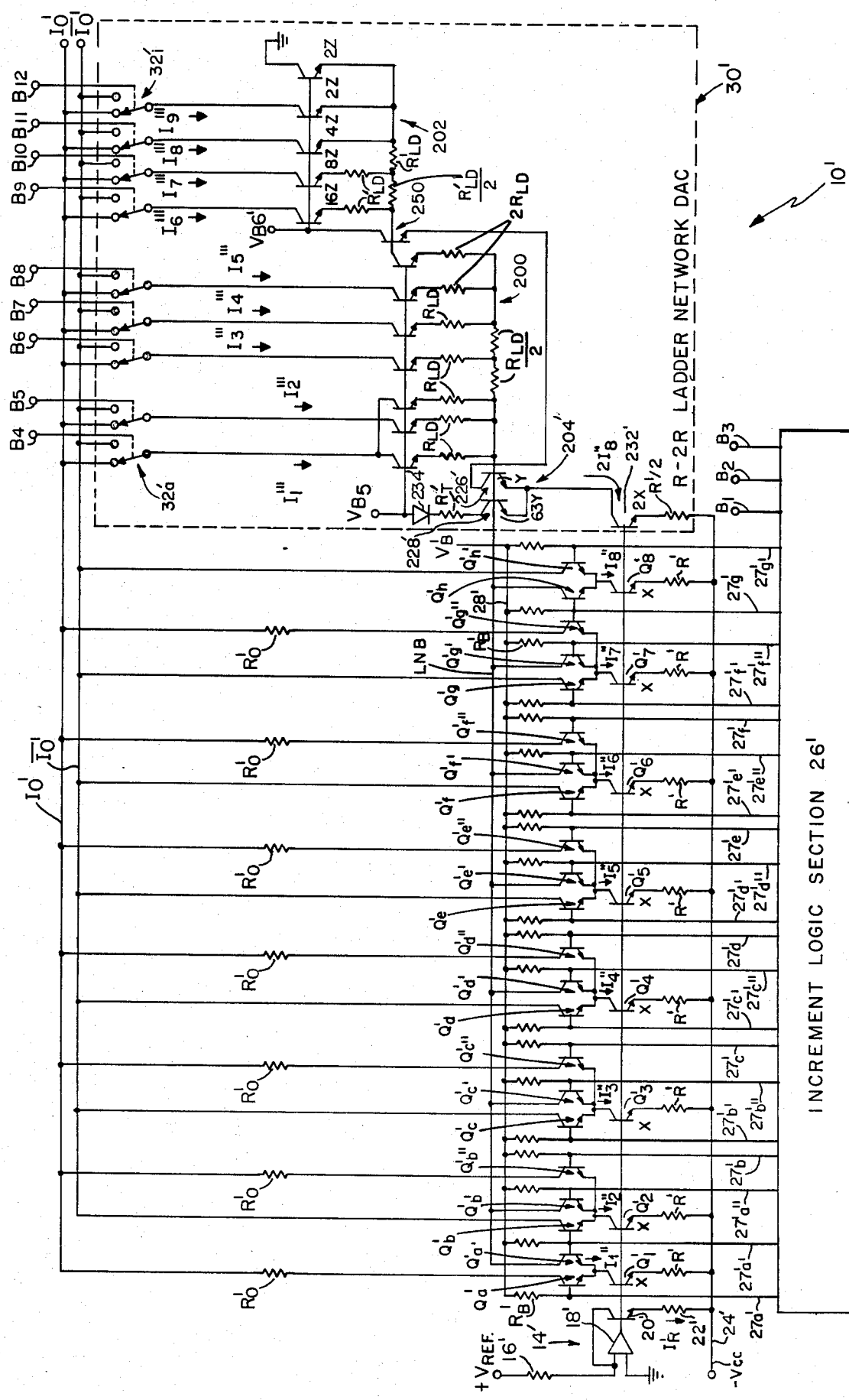
FIG. 3 is a schematic diagram of a 12 bit DAC according to an alternative embodiment of the invention.

Referring now to FIG. 3, an alternative embodiment of a 12 bit DAC 10' is shown. Here eight identical current sources $I_1''$ to $I_8''$ are provided using a reference current source 14' including reference resistor 16', operational amplifier 18', transistor 20' and resistor 22', arranged as shown in a conventional manner to produce a reference current $I_R'$ through reference resistor 22'. A plurality of, here eight, transistors $Q_1'$ to $Q_8'$ are provided with base electrodes thereof connected to the base electrode of transistor 20', as shown. The emitter electrodes of transistors $Q_1'$ to $Q_8'$ are connected to bus 24' through corresponding resistors R', as shown. Here the emitter area of transistor 20' is four times the emitter area of each of the transistors $Q_1'$ to $Q_8'$ and the resistance of resistor 22' is R'/4 so that the current flow through the collector electrodes of each of the transistors $Q_1'$ to $Q_8'$ will be equal to one-fourth of the reference current $I_R'$. Thus, transistors $Q_1'$ to $Q_8'$ provide the plurality of, here 8, identical or equal current sources $I_1''$ to $I_8''$, respectively, as indicated.

Each one of the current sources $I_1''$ to $I_8''$ is connected to a corresponding one of eight sets of switching transistors: $Q'_a, Q'_a'; Q'_b, Q'_b', Q'_b''; Q'_c, Q'_c', Q'_c''; Q'_d, Q'_d', Q'_d''; Q'_e, Q'_e', Q'_e''; Q'_f, Q'_f', Q'_f''; Q'_g, Q'_g', Q'_g''$; and $Q'_h, Q'_h'$, respectively, as shown. The emitter electrodes of each of the transistors in each of the eight sets thereof are connected to a corresponding one of the eight current sources $I_1'$ to $I_8'$, as shown. The base electrodes of such transistors $Q'_a$ to $Q'_h'$ are connected to an increment logic section 26' through control lines $27'_a$, $27'_a'$, $27'_a''$ through $27'_g$, $27'_g'$, respectively, as indicated, and to a bus 28' through equal valued resistor $R_B'$ as indicated. Coupled to bus 28' is a logic voltage $V_B'$. The collector electrodes of transistors $Q'_a, Q'_b'', Q'_c'', Q'_d'', Q'_e'', Q'_f''$ and $Q'_g''$ are connected to output bus $I_o$ through resistors $R_o'$; the collector electrodes of transistors $Q'_b, Q'_c, Q'_d, Q'_e, Q'_f, Q'_g$ and $Q'_h$ are connected to output bus $\overline{I_o'}$; and the collector electrodes of transistors $Q'_a', Q'_b', Q'_c', Q'_d', Q'_e', Q'_f', Q'_g'$ and $Q'_h'$ are connected to a ladder network bus LNB. The ladder network bus LNB is coupled to an R-2R resistor ladder network DAC 30' and the current on such bus LNB provides the reference current for such ladder network 30' similar to that supplied by current source $I_8$ in FIG. 1. The three most significant bits $B_1, B_2, B_3$ (where $B_1$ is the MSB) are coupled to the increment logic section 26', as indicated. The least significant bits $B_4$ to $B_{12}$ (where $B_{12}$ is the LSB) are coupled to the R-2R resistor ladder network DAC 30', as indicated.

In response to bits $B_1, B_2, B_3$ selected ones of the current sources $I_1''$ to $I_8''$ are coupled to output bus $I_o'$, a selected one of the current sources $I_1''$ to $I_8''$ is coupled to ladder network bus LNB to provide the reference current for the R-2R ladder network DAC 30', and the remaining ones of the current sources $I_1''$ to $I_8''$ are coupled to output bus $\overline{I_o'}$, with the sum of the currents produced by the current sources coupled to bus $I_o'$ being proportional to the bits $B_1, B_2, B_3$ of the digital word, the sum of the currents coupled to bus $I_o'$ by the R-2R DAC 30' being proportional to bits $B_4$ to $B_{12}$ of the digital word. Likewise, the sum of the currents coupled to output bus $I_o'$ is proportional to the complement of the digital word in a manner equivalent to that described in connection with the 12 bit DAC 10 of FIG. 1. Here, however, the reference current supplied to the DAC 30' is a selected one of the eight current sources $I_1''$ to $I_8''$. The details of DAC 30' will be described hereinafter. Suffice it to say here, however, that in response to the reference current supplied to DAC 30' from one of the eight current sources $I_1''$ to $I_8''$ binarily weighted currents $I_1'''$ to $I_9'''$ are produced where $I_1''' = I_R'/8$; $I_2''' = I_R'/16$; $I_3''' = I_R'/32$; ... $I_9''' = I_R'/2048$, as indicated. (It is noted that here switches $32a'-32d'$ are represented as double pole, single throw switches but are actually equivalent to switch $32a$ shown in FIG. 1).

Increment logic section 26', the details of which will be described in connection with FIG. 4, produces logical signals on control lines $27'_a$ to $27'_g$ in accordance with the logical states of selected combinations of bits $B_1, B_2$ and $B_3$ as presented in Table VII below:

TABLE VII

| CONTROL LINE | LOGICAL SIGNAL |
|---|---|
| 27'a | $B_1 + B_2 + B_3$ |
| 27'a' | $\overline{B_1 + B_2 + B_3}$ |
| 27'a'' | $B_1 + B_2 + \overline{B_3}$ |
| 27'b | $B_1 + B_2$ |
| 27'b' | $\overline{B_1 + B_2}$ |
| 27'b'' | $B_1 + \overline{B_2} + B_3$ |
| 27'c | $B_1 + (B_2 \cdot B_3)$ |
| 27'c' | $\overline{B_1 + (B_2 \cdot B_3)}$ |
| 27'c'' | $B_1 + \overline{B_2} + \overline{B_3}$ |
| 27'd | $B_1$ |
| 27'd' | $\overline{B_1}$ |
| 27'd'' | $\overline{B_1} + B_2 + B_3$ |
| 27'e | $(B_1 \cdot B_2) + (B_1 \cdot B_3)$ |
| 27'e' | $\overline{(B_1 \cdot B_2) + (B_1 \cdot B_3)}$ |
| 27'e'' | $\overline{B_1} + B_2 + \overline{B_3}$ |
| 27'f | $B_1 \cdot B_2$ |
| 27'f' | $\overline{B_1 \cdot B_2}$ |
| 27'f'' | $\overline{B_1} + \overline{B_2} + B_3$ |
| 27'g | $\overline{B_1} + \overline{B_2} + \overline{B_3}$ |
| 27'g' | $\overline{B_1} + \overline{B_2} + \overline{B_3}$ |

Thus, logical signals are produced on control line 27'a to 27'g' in response to bits $B_1$, $B_2$, $B_3$, may be represented as indicated in Table VIII below:

TABLE VIII

| LOGICAL SIGNAL ON BITS | | | CONTROL SIGNAL ON CONTROL LINES | | | | | | | | | |
|---|---|---|---|---|---|---|---|---|---|---|---|---|
| $B_1$ | $B_2$ | $B_3$ | 27'a | 27'a' | 27'a'' | 27'b | 27'b' | 27'b'' | 27'c | 27'c' | 27'c'' | 27'd |
| 0 | 0 | 0 | 0 | 1 | 0 | 0 | 1 | 0 | 0 | 1 | 0 | 0 |
| 0 | 0 | 1 | 1 | 0 | 1 | 0 | 1 | 0 | 0 | 1 | 0 | 0 |
| 0 | 1 | 0 | 1 | 0 | 0 | 1 | 0 | 1 | 0 | 1 | 0 | 0 |
| 0 | 1 | 1 | 1 | 0 | 0 | 1 | 0 | 1 | 0 | 1 | 0 | 0 |
| 1 | 0 | 0 | 1 | 0 | 0 | 1 | 0 | 0 | 1 | 0 | 0 | 1 |
| 1 | 0 | 1 | 1 | 0 | 0 | 1 | 0 | 0 | 1 | 0 | 0 | 1 |
| 1 | 1 | 0 | 1 | 0 | 0 | 1 | 0 | 0 | 1 | 0 | 0 | 1 |
| 1 | 1 | 1 | 1 | 0 | 0 | 1 | 0 | 0 | 1 | 0 | 0 | 1 |

| LOGICAL SIGNAL ON BITS | | | CONTROL SIGNAL ON CONTROL LINES | | | | | | | | | |
|---|---|---|---|---|---|---|---|---|---|---|---|---|
| $B_1$ | $B_2$ | $B_3$ | 27'd' | 27'd'' | 27'e | 27'e' | 27'e'' | 27'f | 27'f' | 27'f'' | 27'g | 27'g' |
| 0 | 0 | 0 | 1 | 0 | 0 | 1 | 0 | 0 | 1 | 0 | 0 | 1 |
| 0 | 0 | 1 | 1 | 0 | 0 | 1 | 0 | 0 | 1 | 0 | 0 | 1 |
| 0 | 1 | 0 | 1 | 0 | 0 | 1 | 0 | 0 | 1 | 0 | 0 | 1 |
| 0 | 1 | 1 | 1 | 0 | 0 | 1 | 0 | 0 | 1 | 0 | 0 | 1 |
| 1 | 0 | 0 | 0 | 1 | 0 | 1 | 0 | 0 | 1 | 0 | 0 | 1 |
| 1 | 0 | 1 | 0 | 0 | 1 | 0 | 1 | 0 | 1 | 0 | 0 | 1 |
| 1 | 1 | 0 | 0 | 0 | 1 | 0 | 0 | 1 | 0 | 1 | 0 | 1 |
| 1 | 1 | 1 | 0 | 0 | 1 | 0 | 0 | 1 | 0 | 0 | 1 | 0 |

Figure 4:
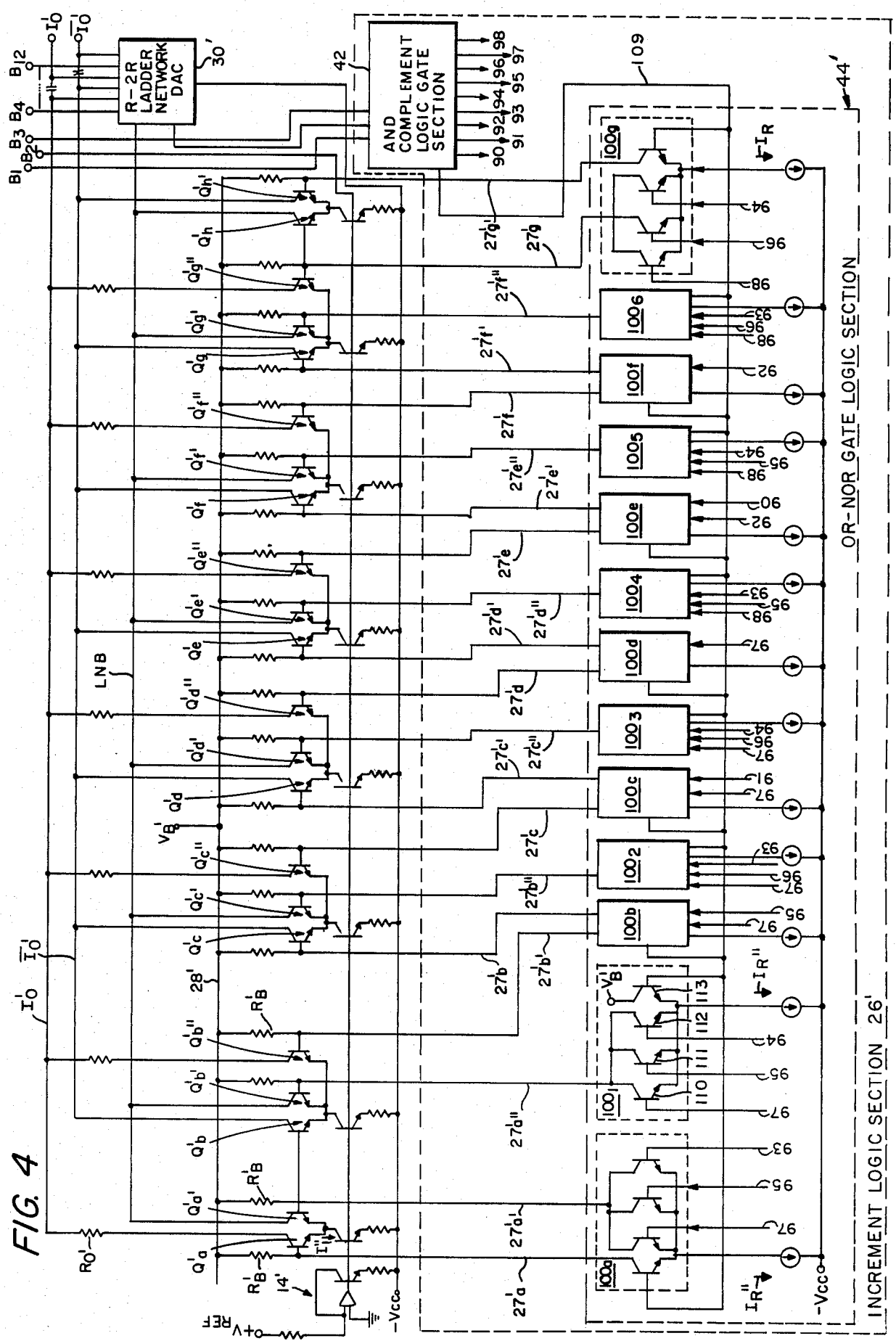
FIG. 4 is a schematic diagram of the 12 bit DAC of FIG. 3 including a schematic diagram of an increment logic section used in such DAC.

Further, as will become more apparent from FIG. 4, current sources $I_1''$ to $I_8''$ are coupled to bus $I_o'$, $\overline{I_o'}$ or LBN selectively in accordance with bits $B_1$, $B_2$, $B_3$ as represented by the following Table IX:

TABLE IX

| LOGICAL SIGNAL ON BITS | | | | | | | | | | |
|---|---|---|---|---|---|---|---|---|---|---|
| $B_1$ | $B_2$ | $B_3$ | $I_1''$ | $I_2''$ | $I_3''$ | $I_4''$ | $I_5''$ | $I_6''$ | $I_7''$ | $I_8''$ |
| 0 | 0 | 0 | LNB | $\overline{I_o'}$ | $\overline{I_o'}$ | $\overline{I_o'}$ | $\overline{I_o'}$ | $\overline{I_o'}$ | $\overline{I_o'}$ | $\overline{I_o'}$ |
| 0 | 0 | 1 | $I_o'$ | LNB | $\overline{I_o'}$ | $\overline{I_o'}$ | $\overline{I_o'}$ | $\overline{I_o'}$ | $\overline{I_o'}$ | $\overline{I_o'}$ |
| 0 | 1 | 0 | $I_o'$ | $I_o'$ | LNB | $\overline{I_o'}$ | $\overline{I_o'}$ | $\overline{I_o'}$ | $\overline{I_o'}$ | $\overline{I_o'}$ |
| 0 | 1 | 1 | $I_o'$ | $I_o'$ | $I_o'$ | LNB | $\overline{I_o'}$ | $\overline{I_o'}$ | $\overline{I_o'}$ | $\overline{I_o'}$ |
| 1 | 0 | 0 | $I_o'$ | $I_o'$ | $I_o'$ | $I_o'$ | LNB | $\overline{I_o'}$ | $\overline{I_o'}$ | $\overline{I_o'}$ |
| 1 | 0 | 1 | $I_o'$ | $I_o'$ | $I_o'$ | $I_o'$ | $I_o'$ | LNB | $\overline{I_o'}$ | $\overline{I_o'}$ |
| 1 | 1 | 0 | $I_o'$ | $I_o'$ | $I_o'$ | $I_o'$ | $I_o'$ | $I_o'$ | LNB | $\overline{I_o'}$ |
| 1 | 1 | 1 | $I_o'$ | $I_o'$ | $I_o'$ | $I_o'$ | $I_o'$ | $I_o'$ | $I_o'$ | LNB |

Therefore, the total current flow through buses $I_o'$, $\overline{I_o'}$ and LBN from equal current sources $I_1''$ to $I_8''$ (each producing a current level $I_R'$) as a function of bits $B_1$, $B_2$, $B_3$ may be represented as indicated below in Table X:

TABLE X

| BITS | | | CURRENT FLOW | | |
|---|---|---|---|---|---|
| $B_1$ | $B_2$ | $B_3$ | $I_o'$ | $\overline{I_o'}$ | LNB |
| 0 | 0 | 0 | 0 | $7I_R'/4$ | $I_R'/4$ |
| 0 | 0 | 1 | $I_R'/4$ | $6I_R'/4$ | $I_R'/4$ |
| 0 | 1 | 0 | $2I_R'/4$ | $5I_R'/4$ | $I_R'/4$ |
| 0 | 1 | 1 | $3I_R'/4$ | $4I_R'/4$ | $I_R'/4$ |
| 1 | 0 | 0 | $4I_R'/4$ | $3I_R'/4$ | $I_R'/4$ |
| 1 | 0 | 1 | $5I_R'/4$ | $2I_R'/4$ | $I_R'/4$ |
| 1 | 1 | 0 | $6I_R'/4$ | $1I_R'/4$ | $I_R'/4$ |
| 1 | 1 | 1 | $7I_R'/4$ | 0 | $I_R'/4$ |

Thus, increment logic section 26' produces $2^N$ levels of current (where N is the number of bits of the digital word fed to section 26') proportional to the digital word represented by such N bits. It is also noted that for each one of the $2^N$ digital words fed to logic section 26' any one of the eight current sources $I_1''$ to $I_8''$ is coupled to the same bus $I_o'$, $\overline{I_o'}$ or LNB through the same switching transistor. Thus, for example, current source $I_4''$ is coupled to output bus $\overline{I_o'}$ in response to digital words $(0)_{10}$ to $(2)_{10}$ and each time such current source is coupled to bus $\overline{I_o'}$ the current produced by such current source passes through the same one of the switching transistors, in particular switching transistor Q'd. Likewise, current source $I_2''$ is coupled to output bus $I_o'$ in response to digital words $(2)_{10}$ to $(7)_{10}$ and each time the current produced by source $I_2''$ passes through the same switching transistor, namely switching transistor Q'b.

Referring now to FIG. 4, the details of increment logic network 26' are shown to include the AND-complement logic gate section 42 shown in FIG. 2 and an OR-NOR gate 44'. Thus, a reference voltage is produced on line 109 and logic signals are produced on lines 90 to 98 in response to bits $B_1$, $B_2$, $B_3$ as summarized in Table V above.

The OR-NOR gate section 44' includes, in addition to the 7 gates 100a to 100g described in FIG. 2, six additional logic gates $100_1$ to $100_6$ as shown. Each one of the additional logic gates $100_1$ to $100_6$ is identical in construction and an exemplary one thereof, here logic gate $100_1$ is shown in detail to include three input transistors 110, 111 and 112 and a reference transistor 113. The emitter electrodes of transistors 110, 111, 112 and 113 are connected together and to a current source $I_R''$ and the collector electrodes of transistors 110, 111 and 112 are connected to control line 27'a''; the collector electrode of transistor 113 is connected to the bias voltage $V_B'$. The base electrodes of transistors 110, 111 and 112 are connected to lines 97, 95 and 94, respectively, as indicated. The base electrode of transistor 113 is coupled to bus 109 and has fed thereto the reference voltage produced by section 42 as described in connection with FIG. 2. It follows then that gate $100_1$ provides a NOR gate function on control line 27'a'' to the signals fed to the base electrodes of transistors 110, 111 and 112. Gates 100a to 100g are connected to lines 90 to 98 as shown in Table VI above. The base electrodes of the input transistors in gates $100_1$ to $100_6$ are connected to lines 90 to 98 of section 42 in accordance with Table XI below:

TABLE XI

| GATE | OUTPUT LINE OF SECTION 42 (LOGIC SIGNALS) |
|---|---|
| $100_1$ | 97,95,94 ($B_1, B_2, \overline{B_3}$) |
| $100_2$ | 97,96,93 ($B_1, B_2, B_3$) |
| $100_3$ | 97,96,94 ($B_1, \overline{B_2}, \overline{B_3}$) |
| $100_4$ | 98,95,93 ($\overline{B_1}, B_2, B_3$) |
| $100_5$ | 98,95,94 ($\overline{B_1}, B_2, \overline{B_3}$) |
| $100_6$ | 98,96,93 ($\overline{B_1}, \overline{B_2}, B_3$) |

It follows then that logic signals are produced on lines $27'a'$ to $27'g$ in response to bits $B_1$, $B_2$, $B_3$ as set forth in TABLE VII above.

Referring now again to FIG. 3 an R-2R ladder network DAC 30' is shown to include the master ladder network 200 and slave ladder network 202 of DAC 30 (FIG. 1) here, however, DAC 30' includes an input section 204' which includes transistors 226', 228', 232', resistor $R_T'$ and diode 234', as shown. Thus, transistor 232' has a base electrode connected to the base electrode of transistor $Q_8'$, and an emitter electrode connected to $-V_{cc}$ through a resistor $R'/2$. The emitter area of transistor 232' is twice ($2\times$) times that of the emitter area (X) of each of the transistors $Q_1'$ to $Q_8'$. Thus, the current through the collector electrode of transistor 232' is $2I_8''$. Further, the ladder network bus LNB is connected to the base electrode of transistors 226', 228'. Transistors 226', 228' have emitter electrodes connected to the collector electrode of transistor 232'; the emitter area of transistor 228' being 63Y and the emitter area of transistor 226' being Y. The collector electrode of transistor 226' is connected to the emitter of transistor 250 (as in DAC 30 (FIG. 1)) and the collector of transistor 228' is connected to the bias voltage $V_{B5}$ through diode 234' and resistor $R_T'$ as in DAC 30. Transistors 226', 228' compensate for base current loss in the transistor in the master ladder network 200 and the switching transistors (not shown) coupled to such master ladder network 200.

Figure 5:
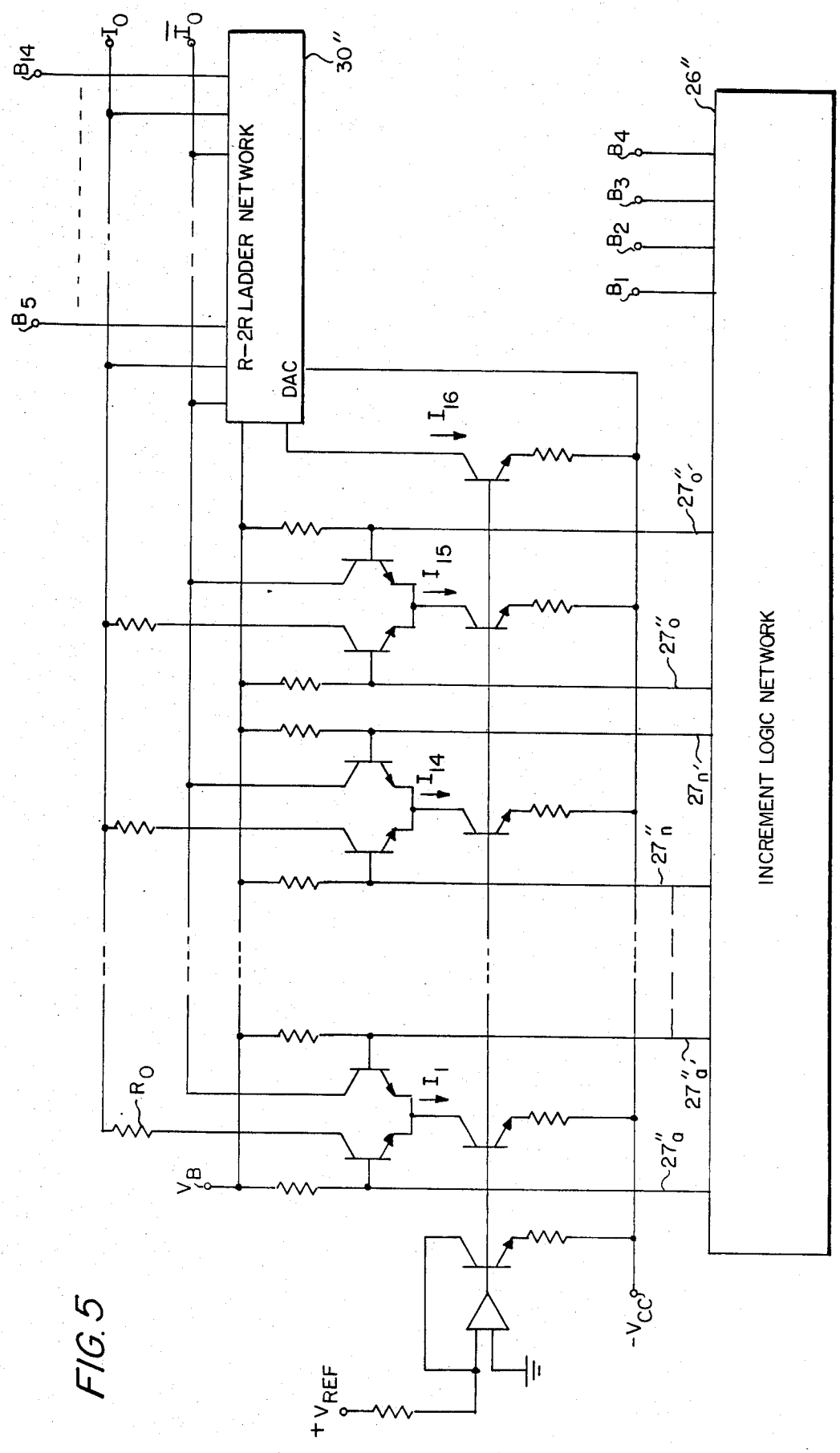
FIG. 5 is a schematic diagram of a 14 bit DAC according to an alternative embodiment of the invention.

Referring now to FIG. 5 a 14 bit DAC is shown with an increment logic network 26" suitably modified to provide control signals on lines $27''a$ to $27''o'$ in accordance with the following Table XII below; such control signals being fed to 15 pairs of transistors, each pair of transistors being fed by an identical current source $I_1$ to $I_{15}$; identical current source $I_{16}$ being fed to a suitably modified R-2R ladder network DAC 30" to convert the 10 least significant bits of such 14 bit digital word.

TABLE XII

| CONTROL LINE | LOGICAL SIGNAL |
|---|---|
| 27"a | $B_1 + B_2 + B_3 + B_4$ |
| 27a' | $\overline{B_1 + B_2 + B_3 + B_4}$ |
| 27"b | $B_1 + B_2 + B_3$ |
| 27"b' | $\overline{B_1 + B_2 + B_3}$ |
| 27"c | $B_1 + B_2 + (B_3 \cdot B_4)$ |
| 27"c' | $\overline{B_1 + B_2 + (B_3 \cdot B_4)}$ |
| 27"d | $B_1 + B_2$ |
| 27"d' | $\overline{B_1 + B_2}$ |
| 27"e | $B_1 + (B_2 \cdot B_3) + (B_2 \cdot B_4)$ |
| 27"e' | $\overline{B_1 + (B_2 \cdot B_3) + (B_2 \cdot B_4)}$ |
| 27"f | $B_1 + (B_2 \cdot B_3)$ |

TABLE XII-continued

| CONTROL LINE | LOGICAL SIGNAL |
|---|---|
| 27"f' | $\overline{B_1 + (B_2 \cdot B_3)}$ |
| 27"g | $B_1 + (B_2 \cdot B_3 \cdot B_4)$ |
| 27"g' | $\overline{B_1 + (B_2 \cdot B_3 \cdot B_4)}$ |
| 27"h | $B_1$ |
| 27"h' | $\overline{B_1}$ |
| 27"i | $(B_1 \cdot B_2) + (B_1 \cdot B_3) + (B_1 \cdot B_4)$ |
| 27"i' | $\overline{(B_1 \cdot B_2) + (B_1 \cdot B_3) + (B_1 \cdot B_4)}$ |
| 27"j | $(B_1 \cdot B_2) + (B_1 \cdot B_3)$ |
| 27"j' | $\overline{(B_1 \cdot B_2) + (B_1 \cdot B_3)}$ |
| 27"k | $(B_1 \cdot B_2) + (B_1 \cdot B_3 \cdot B_4)$ |
| 27"k' | $\overline{(B_1 \cdot B_2) + (B_1 \cdot B_3 \cdot B_4)}$ |
| 27"l | $(B_1 \cdot B_2)$ |
| 27"l' | $\overline{(B_1 \cdot B_2)}$ |
| 27"m | $(B_1 \cdot B_2 \cdot B_3) + (B_1 \cdot B_2 \cdot B_4)$ |
| 27"m' | $\overline{(B_1 \cdot B_2 \cdot B_3) + (B_1 \cdot B_2 \cdot B_4)}$ |
| 27"n | $B_1 \cdot B_2 \cdot B_3$ |
| 27"n' | $\overline{B_1 \cdot B_2 \cdot B_3}$ |
| 27"o | $\overline{B_1} + \overline{B_2} + \overline{B_3} + \overline{B_4}$ |
| 27"o' | $\overline{\overline{B_1} + \overline{B_2} + \overline{B_3} + \overline{B_4}}$ |

Figure 6:
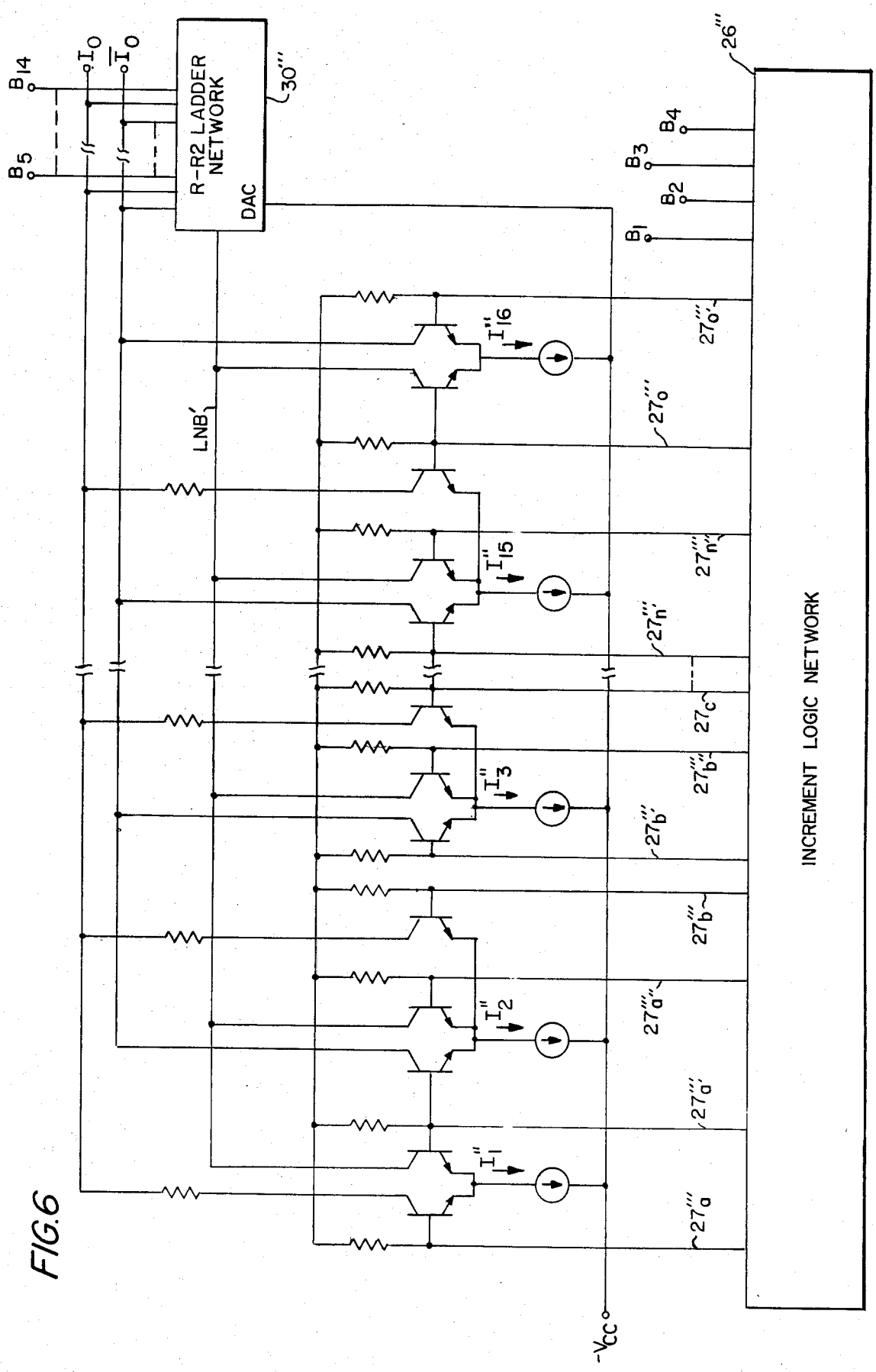
FIG. 6 is a schematic diagram of the 14 bit DAC according to an alternative embodiment of the invention.

Referring now to FIG. 6 an alternative embodiment of a 14 bit DAC is shown to include 16 pairs of transistors coupled to 16 identical current sources $I_1''$ to $I_{16}''$. Control signals on lines $27''a$ to $27''d$ are fed to the transistors, such control signals being produced by increment logic network 26" in accordance with the following Table XIII:

TABLE XIII

| CONTROL LINE | LOGICAL SIGNAL |
|---|---|
| 27'''a | $B_1 + B_2 + B_3 + B_4$ |
| 27'''a' | $\overline{B_1 + B_2 + B_3 + B_4}$ |
| 27'''a" | $B_1 + B_2 + B_3 + \overline{B_4}$ |
| 27'''b | $B_1 + B_2 + B_3$ |
| 27'''b' | $\overline{B_1 + B_2 + B_3}$ |
| 27'''b" | $B_1 + B_2 + \overline{B_3} + B_4$ |
| 27'''c | $B_1 + B_2 + (B_3 \cdot B_4)$ |
| 27'''c' | $\overline{B_1 + B_2 + (B_3 \cdot B_4)}$ |
| 27'''c" | $B_1 + B_2 + \overline{B_3} + \overline{B_4}$ |
| 27'''d | $B_1 + B_2$ |
| 27'''d' | $\overline{B_1 + B_2}$ |
| 27'''d" | $B_1 + \overline{B_2} + B_3 + B_4$ |
| 27'''e | $B_1 + (B_2 \cdot B_3) + (B_2 \cdot B_4)$ |
| 27'''e' | $\overline{B_1 + (B_2 \cdot B_3) + (B_2 \cdot B_4)}$ |
| 27'''e" | $B_1 + \overline{B_2} + B_3 + \overline{B_4}$ |
| 27'''f | $B_1 + (B_2 \cdot B_3)$ |
| 27'''f' | $\overline{B_1 + (B_2 \cdot B_3)}$ |
| 27'''f" | $B_1 + \overline{B_2} + \overline{B_3} + B_4$ |
| 27'''g | $B_1 + (B_2 \cdot B_3 \cdot B_4)$ |
| 27'''g' | $\overline{B_1 + (B_2 \cdot B_3 \cdot B_4)}$ |
| 27'''g" | $B_1 + \overline{B_2} + \overline{B_3} + \overline{B_4}$ |
| 27'''h | $B_1$ |
| 27'''h' | $\overline{B_1}$ |

TABLE XIII-continued

| CONTROL LINE | LOGICAL SIGNAL |
| --- | --- |
| 27'''h'' | $\overline{B_1} + B_2 + B_3 + B_4$ |
| 27'''i | $(B_1 \cdot B_2) + (B_1 \cdot B_3) + (B_1 \cdot B_4)$ |
| 27'''i' | $\overline{(B_1 \cdot B_2) + (B_1 \cdot B_3) + (B_1 \cdot B_4)}$ |
| 27'''i'' | $\overline{B_1} + B_2 + B_3 + \overline{B_4}$ |
| 27'''j | $(B_1 \cdot B_2) + (B_1 \cdot B_3)$ |
| 27'''j' | $\overline{(B_1 \cdot B_2) + (B_1 \cdot B_3)}$ |
| 27'''j'' | $\overline{B_1} + B_2 + \overline{B_3} + B_4$ |
| 27'''k | $(B_1 \cdot B_2) + (B_1 \cdot B_2 \cdot B_4)$ |
| 27'''k' | $\overline{(B_1 \cdot B_2) + (B_1 \cdot B_2 \cdot B_4)}$ |
| 27'''k'' | $\overline{B_1} + B_2 + \overline{B_3} + \overline{B_4}$ |
| 27'''l | $(B_1 \cdot B_2)$ |
| 27'''l' | $\overline{(B_1 \cdot B_2)}$ |
| 27'''l'' | $\overline{B_1} + \overline{B_2} + B_3 + B_4$ |
| 27'''m | $(B_1 \cdot B_2 \cdot B_3) + (B_1 \cdot B_2 \cdot B_4)$ |
| 27'''m' | $\overline{(B_1 \cdot B_2 \cdot B_3) + (B_1 \cdot B_2 \cdot B_4)}$ |
| 27'''m'' | $\overline{B_1} + \overline{B_2} + B_3 + \overline{B_4}$ |
| 27'''n | $B_1 \cdot B_2 \cdot B_3$ |
| 27'''n' | $\overline{B_1 \cdot B_2 \cdot B_3}$ |
| 27'''n'' | $\overline{B_1} + \overline{B_2} + \overline{B_3} + B_4$ |
| 27'''o | $\overline{B_1} + \overline{B_2} + \overline{B_3} + \overline{B_4}$ |
| 27'''o' | $\overline{B_1} + \overline{B_2} + \overline{B_3} + B_4$ |

It is noted that ladder network bus LNB' is coupled to R-2R ladder network DAC 30''' suitably modified to produce binarily weighted currents in response to the current on line LNB', and the 10 least significant bits of the digital word being converted, the current in bus LNB' being from a selected one of the 16 current sources $I''_1$ to $I''_{16}$.

Having described preferred embodiments of the invention, it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. A digital-to-analog converter for producing an output current through an output bus, such current having a level related to a digital word, comprising:
   (a) a first converter section fed by a first portion of the digital word for electrically coupling, or decoupling, a selected one, or ones, of a plurality of equal current sources to, or from, the output bus selectively in accordance with the first portion of the digital word, such first converter section, comprising:
      (i) a plurality of switching transistors, each one thereof having a first electrode coupled to a corresponding one of the plurality of equal current sources; and
      (ii) a plurality of resistor means, each one thereof being coupled between the output bus and a second electrode of a corresponding one of the plurality of switching transistors;
   (b) a second converter section fed by a second portion of the digital word, for electrically coupling, or decoupling, a selected one, or ones, of a plurality of binarily weighted current sources to, or from, the output bus selectively in accordance with the second portion of the digital word, such plurality of binarily weighted current sources, comprising:
      (i) a plurality of current source transistors; and
      (ii) a resistor ladder network having resistors disposed in rungs thereof, such resistors being connected to emitter electrodes of the current source transistors; and
   (c) wherein the resistances of the plurality of resistors of the first converter section are selected to produce a voltage drop across each one thereof equal to a voltage drop produced by one of the binarily weighted current sources across one of the resistors in the rungs of the resistor ladder network.

2. A digital-to-analog converter adapted to produce an output current through an output bus having a level related to a digital work, comprising:
   (a) a plurality of current sources;
   (b) a plurality of pairs of transistors, each one of the pair of transistors having control electrodes, first electrodes coupled together and to a corresponding one of the current sources and second electrodes, the second electrode of a first one of the transistors in the pairs of transistors being coupled to the output bus and the second electrode of the second one of the transistors of each of the pairs of transistors being coupled to an additional output bus;
   (c) logic network means, coupled to the control electrodes of the plurality of pairs of transistors and bits of the digital word, for producing on the plurality of control electrodes a plurality of control signals, at least one thereof being a function of a plurality of the bits, and for coupling in response to the control signals a selected one, or ones, of the current sources to the output bus through the first one of the transistors in each of the pairs of transistors coupled to the selected one, or ones of the current sources and for coupling an unselected one, or ones, of the current sources to the additional output bus through the second one of the transistors in the pairs of transistors coupled to the unselected one, or ones, of the current sources and for producing a voltage at the outputs of the plurality of current sources, such voltage produced at the output of each current source being substantially constant independent of the bits of the digital word producing the control signals and also independent of whether current is passing from the current sources to the output bus or to the additional output bus; and, wherein the logic network means comprises:
      (i) a first plurality of logic gates, each one thereof being fed by at least one of the bits of the digital word for producing a first plurality of output signals representing first logic functions of the bits of the digital word;
      (ii) a second plurality of logic gates fed by the first plurality of output signals for producing the control signals, such control signals being representative of second logic functions of the first plurality of output signals;
      (iii) a second plurality of current sources, each one comprising a transistor, each one thereof being coupled to a corresponding one of the first plurality of logic gates; and (iv) a reference current source means comprising a reference transistor for producing a reference current, the plurality of transistors of the second plurality of current sources being matched to the reference transistor of the reference current source means, the reference current source means providing a logical threshold signal for the second plurality of logic gates.

3. A ditital-to-analog converter adapted to electrically couple, or decouple, a selected one, or ones, or a plurality of current sources to, or from, an output bus selectively in accordance with a digital word being converted to produce an output current through the output bus having a level related to such digital word, comprising:
   (a) a logic network means, for selectively combining a plurality of pairs of complementary bits of the digital word to produce a plurality of pairs of complementary control signsls, a portion thereof being related to a plurality of the bits of the digital word;
   (b) a plurality of pairs of transistors, a first one of the transistors in each of the pairs thereof having: a control electrode fed by a corresponding one of the pairs of complementary control signals; a first electrode coupled to an output of a corresponding one of the plurality of current sources; and a second electrode coupled to the output bus; a second one of the transistors in each one of the pairs having: a first electrode coupled to the output of the corresponding one of the current sources coupled to said one of the pairs of transistors; a control electrode fed by the other one of the pair of complementary control signals; and a second electrode coupled to an additional output bus; and
   (c) means coupled to the plurality of pairs of transistors for biasing the transistors in each of the pairs thereof to opposite conduction states selectively in accordance with the pairs of complementary control signals fed to the control electrodes thereof and for producing substantially the same voltage at the output of the current source coupled to such pair of transistors independent of the conduction states of the transistors in each of the pairs thereof and also independent of the logical state of the bits of the digital word producing the control signals; and, wherein the logic network comprises:
   (i) a first plurality of logic gates, each one thereof being fed by at least one of the bits of the digital word for producing a first plurality of output signals representing logic functions of the bits of the digital word;
   (ii) a second plurality of logic gates fed by the first plurality of output signals for producing the control signals, such control signals being representative of second logic functions of the first plurality of output signals;
   (iii) a second plurality of current sources, each one comprising a transistor, each one thereof being coupled to a corresponding one of the first plurality of logic gates; and
   (iv) a reference current source means comprising a reference transistor for producing a reference current, the plurality of transistors of the second plurality of current sources being matched to the reference transistor of the reference current sources means, the reference current source means providing a logical threshold signal for the second plurality of logic gates.

4. Digital-to-analog conversion circuitry comprising:
   (a) a logic network for selectively combining a plurality of bits of digital word producing a plurality of control signals, at least one thereof being related to a plurality of bits of the digital word;
   (b) a plurality of equal current sources;
   (c) a plurality of pairs of transistors, fed by the control signals, first electrodes of each pair thereof being coupled to an output of a corresponding one of the plurality of equal current sources, and second electrodes of the pair of transistors being coupled to different output buses; and
   (d) wherein such logic network includes means for electrically coupling each one of the current sources to either a first one of the output buses through one of the transistors in the pairs thereof or a second one of output buses through the other one of the transistor in the pair thereof selectively in accordance with the control signals fed to the control electrode of the transistors in such pair thereof and for producing substantially the same voltage at the output of such current source independent of the one of the transistors coupling the current from the current source to the one of the output buses coupled thereto; and, wherein the logic network comprises:
   (i) a first plurality of logic gates, each one thereof being fed by at least one of the bits of the digital word for producing a first plurality of output signals representing first logic functions of the bits of the digital word;
   (ii) a second plurality of logic gates fed by the first plurality of output signals for producing the control signals, such control signsls being representative of second logic functions of the first plurality of output signals;
   (iii) a second plurality of current sources, each one comprising a transistor, each one thereof being coupled to a corresponding one of the first plurality of logic gates; and
   (iv) a reference current source means comprising a reference transistor for producing a reference current, the plurality of transistors of the second plurality of current sources being matched to the reference transistor of the reference current source means, the reference current source means providing a logical threshold signal for the second plurality of logic gates.

5. The circuit recited in claim 4 wherein each one of the transistors in the plurality of pairs of transistors is a bipolar transistor having as the control electrode thereof a base electrode, as the first electrode thereof an emitter electrode, and as the second electrode thereof a collector electrode, and wherein each one of the base electrodes is coupled to a bus through a resistor.

6. The circuit recited in claim 5 wherein the bus is adapted for coupling to a reference voltage source.

7. The circuit recited in claim 4 wherein the logic network comprises:
   (a) a first plurality of logic gates, each one thereof being fed by at least one of the bits of the digital word for producing a first plurality of output signals representing AND and complementary logic functions of the bits of the digital word; and
   (b) a second plurality of logic gates fed by the first plurality of output signals for producing the control signals, such control signals being representative of NOR and OR logic functions of the first plurality of output signals.

8. Digital-to-analog conversion circuitry comprising:
(a) a logic network for selectively combining a plurality of bits of digital word producing a plurality of control signals, at least one thereof being related to a plurality of bits of the digital word;
(b) a plurality of equal current sources;
(c) a plurality of transistors, each one thereof having a control electrode fed by a corresponding one of the control signals, a first electrode coupled to a corresponding one of the plurality of equal current sources, and a second electrode coupled to an output bus; and,
(d) wherein such logic network includes means for electrically coupling each one of the current sources to, or electrically decoupling such one of the current sources from, the output bus selectively in accordance with the control signal fed to the control electrode such one of the transistors coupled to such one of the current sources; and, wherein the logic network comprises:
  (i) a first plurality of logic gates, each one thereof being fed by at least one of the bits of the digital word for producing a first plurality of output signals representing first logic functions of the bits of the digital word;
  (ii) a second plurality of logic gates fed by the first plurality of output signals for producing the control signals, such control signals being representative of second logic functions of the first plurality of output signals;
  (iii) a second plurality of current sources, each one comprising a transistor, each one thereof being coupled to a corresponding one of the first plurality of logic gates; and
  (iv) a reference current source means comprising a reference transistor for producing a reference current, the plurality of transistors of the second plurality of current sources being matched to the reference transistor of the reference current source means, the reference current source means providing a logical threshold signal for the second plurality of logic gates.

9. The circuit recited in claim 8 wherein each one of the first plurality of logic gates includes a reference transistor and at least one input transistor, such transistors having emitter electrodes coupled to a corresponding one of the second plurality of current sources and wherein each one of such logic gates produces one of the first plurality of output logic signals in accordance with the bits fed to the base electrode of the at least one input transistor and wherein each one of such logic gates produces one of such output logic signals at the collector electrode of one of the transistors thereof.

10. The circuit recited in claim 9 wherein the reference current source means includes a reference resistor coupled to the collector electrode of the reference transistor, and wherein such collector electrode provides the logical reference signal for the second plurality of logic gates.

11. The circuit recited in claim 10 wherein each one of the second plurality of gates includes at least one input transistor and a reference transistor, the collector electrodes of the at least one input transistor and the reference transistor being coupled to the control electrodes of the switching transistors, the base electrodes of the reference transistor being coupled to the collector electrode of the reference transistor of the current source means and the base electrodes of the at least one input transistor of the second plurality of gates being coupled to collector electrodes of the first plurality of gates.

12. The circuit recited in claim 4 wherein the logic network comprises:
(a) a first plurality of logic gates, each one thereof being fed by at least one of the bits of the digital word for producing a first plurality of output signals representing first logic functions of the bits of the digital word; and
(b) a second plurality of logic gates fed by the first plurality of output signals for producing the control signals, such control signals being representative of second logic functions of the first plurality of output signals.

* * * * *